(12) United States Patent
Koay

(10) Patent No.: US 7,906,965 B2
(45) Date of Patent: Mar. 15, 2011

(54) METHODS AND APPARATUSES FOR ESTIMATING THE ELLIPTICAL CONE OF UNCERTAINTY

(75) Inventor: Cheng Guan Koay, Rockville, MD (US)

(73) Assignee: The United States of America as represented by the Department of Health and Human Services, Washington, DC (US)

( * ) Notice: Subject to any disclaimer, the term of this patent is extended or adjusted under 35 U.S.C. 154(b) by 298 days.

(21) Appl. No.: 12/263,569

(22) Filed: Nov. 3, 2008

(65) Prior Publication Data

US 2009/0118608 A1 May 7, 2009

Related U.S. Application Data

(60) Provisional application No. 60/996,169, filed on Nov. 5, 2007.

(51) Int. Cl.
*G01V 3/00* (2006.01)
(52) U.S. Cl. .......................................... 324/312; 324/309
(58) Field of Classification Search .................. 324/312, 324/309
See application file for complete search history.

(56) References Cited

U.S. PATENT DOCUMENTS

| 6,642,716 | B1 | 11/2003 | Hoogenraad et al. | |
|---|---|---|---|---|
| 6,845,342 | B1 | 1/2005 | Basser et al. | |
| 7,225,104 | B2 * | 5/2007 | Nara et al. | 702/179 |
| 7,672,790 | B2 * | 3/2010 | McGraw et al. | 702/19 |
| 2006/0229856 | A1 | 10/2006 | Burrus et al. | |
| 2007/0217664 | A1 | 9/2007 | Flipo et al. | |
| 2010/0225316 | A1 * | 9/2010 | Jacob et al. | 324/309 |

OTHER PUBLICATIONS

Le Bihan, D., et al., "Diffusion Tensor Imaging: Concepts and Applications," Journal of Magnetic Resonance Imaging 13:534-546, 2001.
Koay, C.G., et al., "Error Propagation Framework for Diffusion Tensor Imaging Via Diffusion Tensor Representations," IEEE Transactions on Medical Imaging, vol. 26, No. 8, Aug. 2007, pp. 1017-1034.
Koay, C.G., et al., "The Elliptical Cone of Uncertainty and its Normalized Measures in Diffusion Tensor Imaging," IEEE Transactions on Medical Imaging, vol. 27, No. 8, Jun. 2008, pp. 834-844.
Koay, C.G., et al., "The Elliptical Cone of Uncertainty in Diffusion Tensor Imaging and Its Normalized Measures," Proc. Intl. Soc. Mag. Reson. Med. 16, 2008.

* cited by examiner

*Primary Examiner* — Louis M Arana
(74) *Attorney, Agent, or Firm* — Polsinelli Shughart PC; Teddy C. Scott, Jr.; Paul A. Jenny

(57) ABSTRACT

A magnetic resonance imaging scanner acquires diffusion-weighted imaging data. A reconstruction engine reconstructs the acquired diffusion-weighted imaging data into diffusion-weighted image representations. A diffusion tensor engine constructs a diffusion tensor map of an area of an interest of a subject. An eigenvalue/eigenvector ordering engine obtains and orders eigenvectors and eigenvalues at each voxel. A covariance matrix determining engine constructs a covariance matrix of a major eigenvector of each voxel. A first normalized measure determining engine computes a first normalized measure. A second normalized measure determining engine computes a second normalized measure. A rendering engine generates a human-viewable display of an image representation.

18 Claims, 8 Drawing Sheets

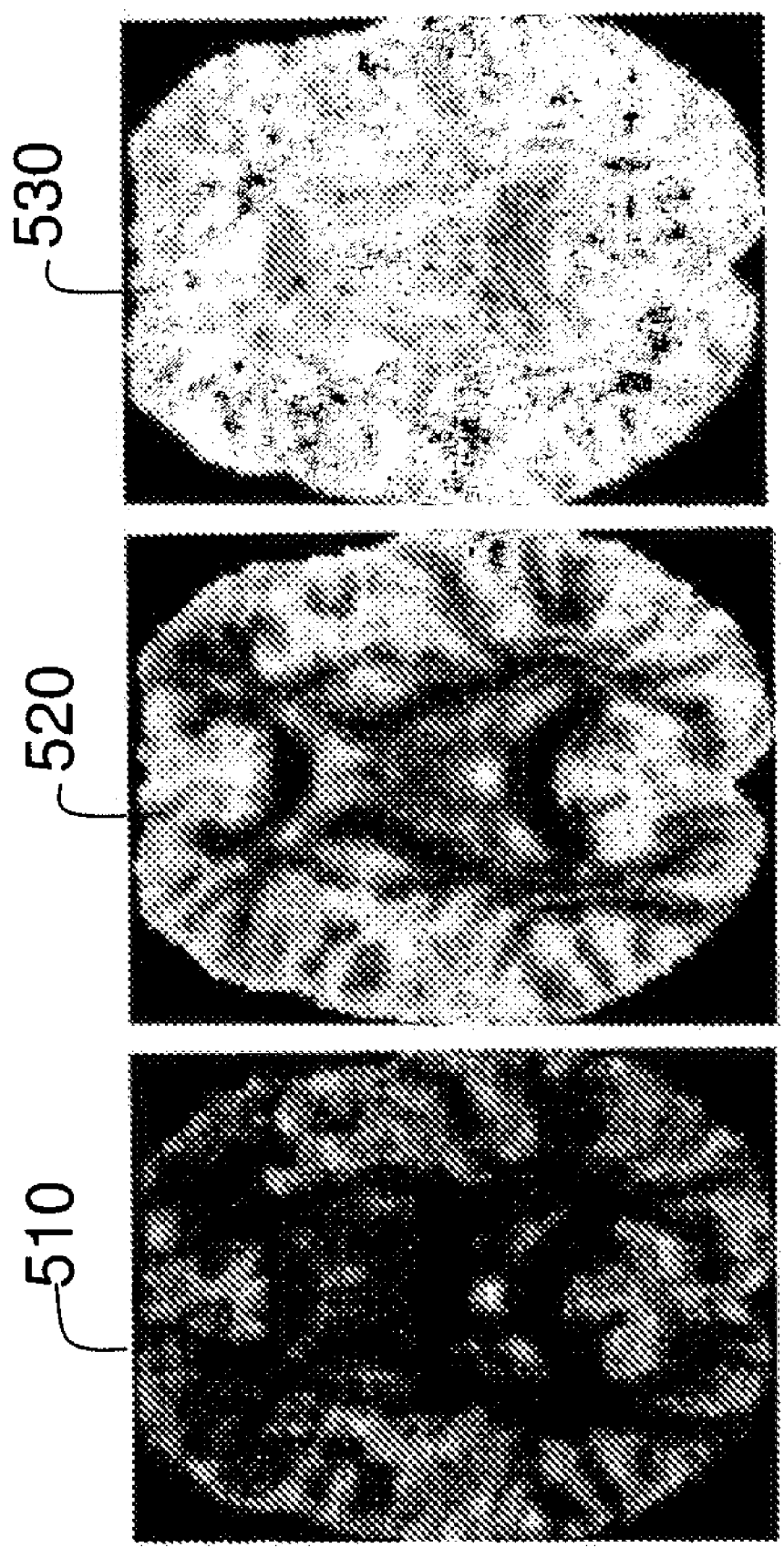

METHODS AND APPARATUSES FOR ESTIMATING THE ELLIPTICAL CONE OF UNCERTAINTY

This application claims the benefit of U.S. Provisional Application No. 60/996,169 filed on Nov. 5, 2007, of the common assignee, entitled "Methods and Apparatuses for Estimating the Elliptical Cone of Uncertainty," the contents of which are incorporated by reference in their entirety.

BACKGROUND

The following relates to the magnetic resonance arts. It particularly relates to the imaging, tracking, and displaying of neural fibers and fiber bundles by diffusion tensor magnetic resonance imaging (DT-MRI), and will be described with particular reference thereto. However, it will also find application in conjunction with the tracking and graphical rendering of other types of fibrous structures as well as with other imaging modalities such as single photon emission computed tomography imaging (SPECT), computed tomography (CT), positron emission tomography (PET), and also in crystallography and geophysics.

Nerve tissue in human beings and other mammals includes neurons with elongated axonal portions arranged to form neural fibers or fiber bundles, along which electrochemical signals are transmitted. In the brain, for example, functional areas defined by very high neural densities are typically linked by structurally complex neural networks of axonal fiber bundles. The axonal fiber bundles and other fibrous material are substantially surrounded by other tissue.

Diagnosis of neural diseases, planning for brain surgery, and other neurologically related clinical activities as well as research studies on brain functioning may benefit from non-invasive imaging and tracking of the axonal fibers and fiber bundles. In particular, diffusion tensor magnetic resonance imaging (DT-MRI) has been shown to provide image contrast that correlates with axonal fiber bundles. In the DT-MRI technique, diffusion-sensitizing magnetic field gradients are applied in the excitation/imaging sequence so that the magnetic resonance images include contrast related to the diffusion of water or other fluid molecules. By applying the diffusion gradients in selected directions during the excitation/imaging sequence, diffusion weighted images are acquired from which diffusion tensor coefficients are obtained for each voxel location in image space.

The intensity of individual voxels are fitted to calculate six independent variables in a 3×3 diffusion tensor. The diffusion tensor is then diagonalized to obtain three eigenvalues and corresponding three eigenvectors. The eigenvectors represent the local direction of the brain fiber structure at the voxel at issue. Within an imaging voxel, the directional information of white matter tracts is usually obtained from the major eigenvector of the diffusion tensor.

Using the local directional information, a global anatomical connectivity of white matter tracts is constructed. Each time the tracking connects a pixel to the next pixel, judgment is made whether the fiber is continuous or terminated based on randomness of the fiber orientation of the adjacent pixels. The interplay between the local directional and global structural information is crucial in understanding changes in white matter tracts. However, image noise may produce errors in the calculated tensor, and, hence, in its eigenvalues and eigenvectors. There is an uncertainty associated with every estimate of fiber orientation. Accumulated uncertainties in fiber orientation may lead to erroneous reconstruction of pathways. It is difficult to trace reliably in the uncertain areas.

It is desirable to determine and display the tract dispersion, e.g., the eigenvectors and the associated uncertainties. For example, the unit eigenvector may be displayed with a cone of uncertainty around its tip. This conveys the notion that the direction of fiber is not known precisely.

However, the methods known in the art are directed to computation and visualization of a circular cone of uncertainty. These methods are not suitable for practical computation and visualization of an elliptical cone of uncertainty.

There is a need for the apparatuses and methods to overcome the above-referenced problems and others.

BRIEF DESCRIPTION

One embodiment includes a magnetic resonance imaging apparatus, including: a magnetic resonance imaging scanner to acquire diffusion-weighted imaging data of a subject; a reconstruction engine to reconstruct the acquired diffusion-weighted imaging data into diffusion-weighted image representations of the subject; a diffusion tensor engine to construct a diffusion tensor map of an area of interest of the subject; an eigenvalue/eigenvector ordering engine to obtain and order pairs of eigenvectors and eigenvalues for at least one voxel in the diffusion tensor map; a covariance matrix determining engine to construct a covariance matrix of a major eigenvector for at least one voxel for which pairs of eigenvectors and eigenvalues have been obtained and ordered; a first normalized measure determining engine to compute a first normalized measure of at least one voxel for which the covariance matrix has been constructed; a second normalized measure determining engine to compute a second normalized measure of at least one voxel for which the covariance matrix has been constructed; and a rendering engine to generate a human-viewable display of an image representation of uncertainty.

One embodiment includes a magnetic resonance imaging method, including: acquiring a three-dimensional diffusion tensor map of an area of interest of a subject; processing the diffusion tensor for at least one voxel to obtain pairs of eigenvectors and eigenvalues; constructing a covariance matrix of a major eigenvector for at least one voxel; computing first and second normalized uncertainty measures of at least one voxel; and generating a human-viewable display of an image representation of uncertainty.

One embodiment includes a magnetic resonance imaging apparatus, including: means for acquiring diffusion-weighted imaging data of a subject; means for reconstructing the acquired diffusion-weighted imaging data into diffusion-weighted image representations of the subject; means for constructing a diffusion tensor map of an area of interest of the subject; means for obtaining and ordering eigenvectors and eigenvalues for at least one voxel; means for constructing a covariance matrix of a major eigenvector for at least one voxel; means for computing a first normalized uncertainty measure; means for computing a second normalized uncertainty measure; and means for generating a human-viewable display of an image representation of uncertainty.

One embodiment provides a computer-readable medium comprising software, which software, when executed by a computer system, causes the computer to perform operations to analyze diffusion-weighted imaging representations reconstructed from acquired diffusion-weighted imaging data of a subject, the computer-readable medium includes: instructions to construct a diffusion tensor map of an area of interest of the subject; instructions to obtain and order eigenvectors and eigenvalues for at least one voxel; instructions to construct a covariance matrix of a major eigenvector for at least one voxel; instructions to compute a first normalized uncertainty measure of at least one voxel; instructions to compute a second normalized uncertainty measure of at least one voxel; and instructions to generate a human-viewable display of an image representation of uncertainty.

BRIEF DESCRIPTION OF THE DRAWINGS

The foregoing and other features of various embodiments of the invention will be apparent from the following, more particular description of such embodiments of the invention, as illustrated in the accompanying drawings, wherein like reference numbers generally indicate identical, functionally similar, and/or structurally similar elements.

FIG. 5A illustrates an exemplary normalized areal measure map;

FIG. 5B illustrates an exemplary normalized circumference map;

FIG. 5C illustrates an exemplary eccentricity map of the ellipse of the cone of uncertainty;

DETAILED DESCRIPTION

Exemplary embodiments are discussed in detail below. While specific exemplary embodiments are discussed, it should be understood that this is done for illustration purposes only. In describing and illustrating the exemplary embodiments, specific terminology is employed for the sake of clarity. However, the invention is not intended to be limited to the specific terminology so selected. A person skilled in the relevant art will recognize that other components and configurations may be used without parting from the spirit and scope of the invention. It is to be understood that each specific element includes all technical equivalents that operate in a similar manner to accomplish a similar purpose. Each reference cited herein is incorporated by reference. The examples and embodiments described herein are non-limiting examples.

Figure 1A:
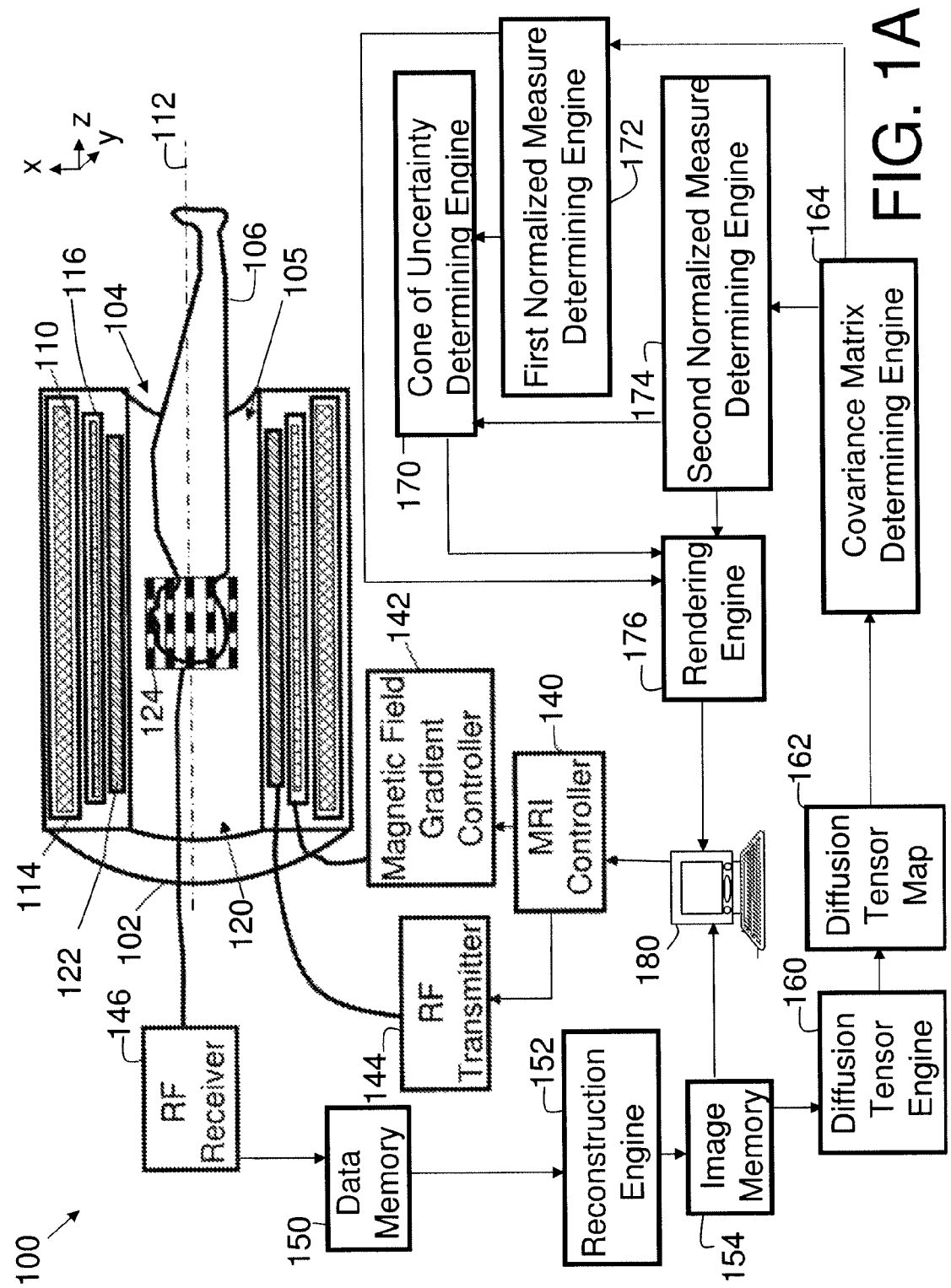
FIG. 1A diagrammatically illustrates an exemplary magnetic resonance imaging system according to an exemplary embodiment of the invention.

With reference to FIG. 1A, a magnetic resonance imaging scanner or system 100 may include a housing 102 defining a generally cylindrical scanner bore 104 defining an examination region 105, inside of which an associated imaging subject 106 is disposed. The subject 106 may be, for example, a human patient, an animal, a phantom, etc. In FIG. 1A, the housing 102 is shown in cross-section to illustrate the inside of the housing 102. Main magnetic field coils 110 may be disposed inside the housing 102, and may produce a main $B_0$ magnetic field parallel to a central axis 112 of the scanner bore 104. In FIG. 1A, the direction of the main $B_0$ magnetic field is parallel to the z-axis of the reference x-y-z Cartesian coordinate system. Main magnetic field coils 110 are typically superconducting coils disposed inside cryoshrouding 114, although resistive main magnets may also be used. The main magnetic field coils 110 may generate the main $B_0$ magnetic field, which may be substantially uniform in an imaging volume of the bore 104.

The housing 102 also houses or supports magnetic field gradient coil(s) 116 for selectively producing known magnetic field gradients parallel to the central axis 112 of the bore 104, along in-plane directions transverse to the central axis 112, or along other selected directions. In one embodiment, the gradient coil(s) 116 are shielded with shielding coil(s) (not shown). The shielding coils are designed to cooperate with the gradient coil 116 to generate a magnetic field which has a substantially zero magnetic flux density outside an area defined by the outer radius of the shielding coil(s).

The magnetic resonance imaging scanner 100 may include a radio frequency coil arrangement or system 120 disposed inside the bore 104 to selectively excite and/or detect magnetic resonances. In one embodiment, the coil system 120 may include a whole body coil 122 and a local coil positioned in a proximity to the intended volume of examination, such as a head coil 124. The coils 122, 124 may include a TEM coil, a hybrid TEM-birdcage coil, a birdcage resonator, an arrangement of loop resonators, or the like. The coils 122, 124 may include a plurality of resonators positioned around or in the intended volume of examination. The coils 122, 124 may be, for example, circularly cylindrical, but, of course, might have other geometries, such as an elliptic cross-section, semi-circular cross-section, semi-elliptical cross-section, and the like.

An MRI controller 140 may operate magnetic field gradient controller or controllers 142 coupled to the gradients coils 116 to superimpose selected magnetic field gradients on the main magnetic field in the examination region, and may also operate a radio frequency transmitter or transmitters 144 each coupled to an individual radio frequency coil segment to inject selected radio frequency excitation pulses at about the magnetic resonance frequency into the examination region for imaging. The radio frequency transmitter or transmitters 144 may be individually controlled and may have different phases and amplitudes.

Magnetic resonance is generated and spatially encoded in at least a portion of a region of interest of the imaging subject 106. By applying selected magnetic field gradients via the gradient coils 116, a selected k-space trajectory is traversed, such as a Cartesian trajectory, a plurality of radial trajectories, or a spiral trajectory. Alternatively, imaging data may be acquired as projections along selected magnetic field gradient directions. During imaging data acquisition, a radio frequency receiver or receivers 146 coupled to the head coil 124 may acquire magnetic resonance samples that are stored in a magnetic resonance data memory 150. Of course, it is contemplated that the magnetic resonance signals may be excited and received by a single coil array such as the whole body coil 122 or the local coil 124.

The MRI sequence may include a complex series of magnetic field gradient pulses and/or sweeps generated by the gradient coils 116 which along with selected RF pulses generated by the coils 122, 124 result on magnetic resonance echoes. For diffusion tensor magnetic resonance imaging (DT-MRI), data is acquired without diffusion weighting, and with diffusion weighting in N directions. Six diffusion directions may provide sufficient information to construct the diffusion tensor at each voxel. A reconstruction engine 152 may reconstruct the imaging data into an image representation, e.g., diffusion-weighted image representations. The reconstructed image generated by the reconstruction engine 152 may be stored in an image memory 154.

A diffusion tensor engine 160 may calculate a plurality of diffusion coefficients values on a per voxel basis, as known in the art, to construct a diffusion tensor map 162. For each voxel, a tensor, e.g., a symmetric positive definite 3×3 matrix, that describes a three dimensional shape of diffusion may be calculated. The diffusion tensor at each voxel may be processed to obtain eigenvectors and eigenvalues.

As described in a greater detail below, a covariance matrix determining engine 164 may construct a covariance matrix of, for example, the major eigenvector at each voxel. It is contemplated that covariance matrices of the medium and minor eigenvectors may be constructed as well. A cone of uncertainty (COU) determining engine 170 may construct or determine a cone of uncertainty (COU) based on the covariance matrix. A first normalized measure engine 172 may determine a first normalized measure of the elliptical COU. A second normalized measure engine 174 may determine a second normalized measure or a normalized circumference of the elliptical COU.

A rendering engine 176 may format the constructed cones of uncertainty, normalized areal maps, normalized circumference maps, or any other appropriate image representations to be displayed on a user interface 180, stored in non-volatile memory, transmitted over a local intranet or the Internet, viewed, stored, manipulated, or so forth.

Major eigenvector maps represent the fiber orientation and may be visualized as vector-field or color coded maps giving a cartography of the tracts' position and direction. The brightness may be weighted by a fractional anisotropy which is a scalar measure of a degree of anisotropy for a given voxel. To visualize the fiber direction map in the context of a conventional structural image, the fiber map may be registered to and superimposed on a structural image, for example, on a high resolution MR image, as known in the art. The fiber orientation information provided by the diffusion imaging maps may be used to differentiate among nerve fiber pathways to determine abnormalities. Further, the fiber orientation information provided by the diffusion imaging maps may be used to delineate anatomical structures based on a priori distinct fiber architecture of each anatomical structure.

The user interface 180 may also enable a radiologist, technician, or other operator of the magnetic resonance imaging scanner 100 to communicate with the magnetic resonance imaging controller 140 to select, modify, and execute magnetic resonance imaging sequences.

Figure 1B:
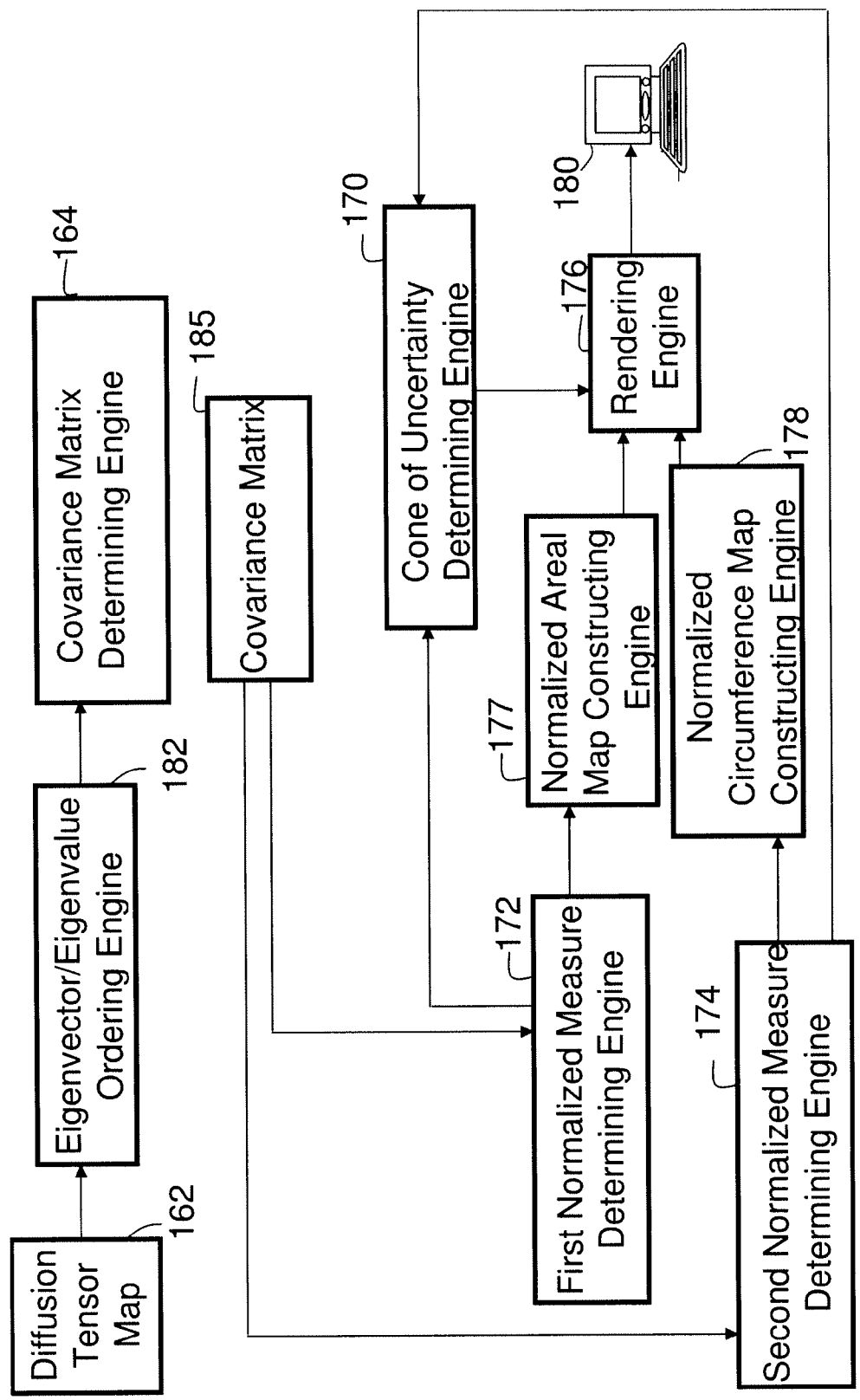
FIG. 1B diagrammatically illustrates a portion of an exemplary magnetic resonance imaging system according to an exemplary embodiment of the invention.
Figure 1C:
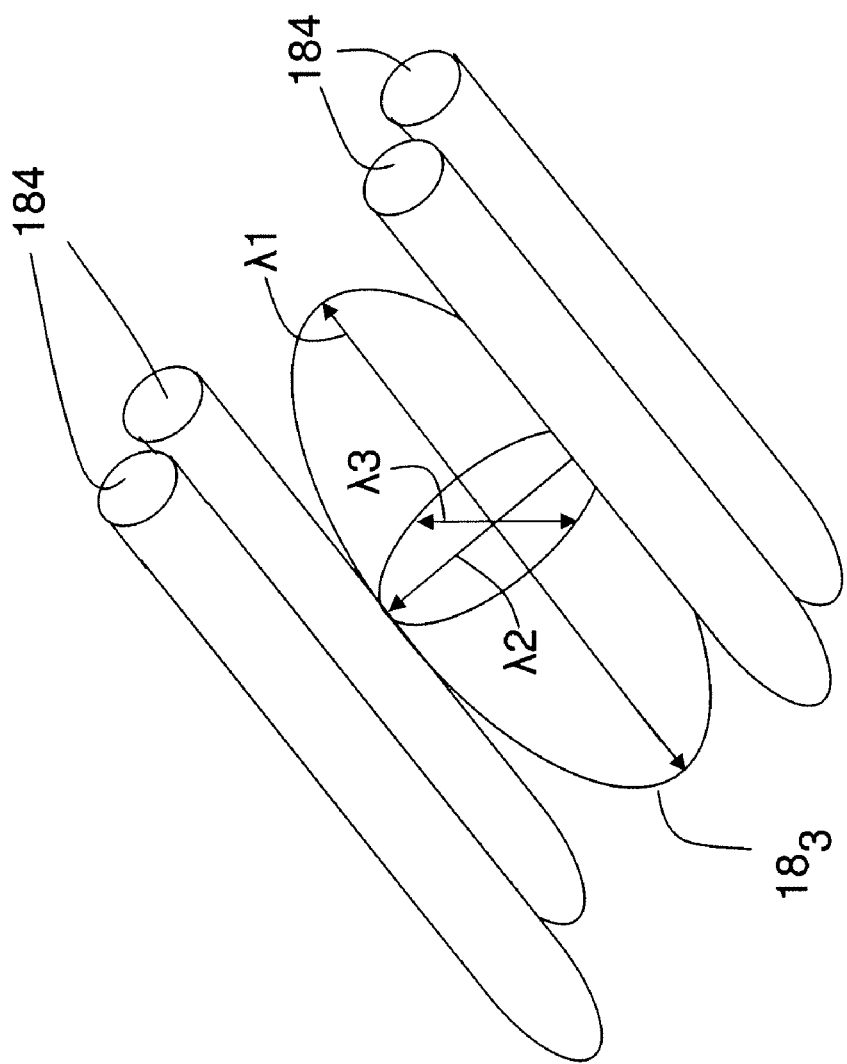
FIG. 1C diagrammatically illustrates the eigenvectors and eigenvalues of the diffusion tensor and their relationship with axonal fibers or fiber bundles.

With continuing reference to FIG. 1A and further reference to FIGS. 1B and 1C, an eigenvector/eigenvalue ordering engine 182 may order the diffusion tensor eigenvectors and eigenvalues for each voxel to obtain ordered eigenvectors and eigenvalues. For example, the eigenvector/eigenvalue ordering engine 182 may order eigenvalues from largest to smallest eigenvalue $\lambda 1, \lambda 2, \lambda 3$. The eigenvector which corresponds to the largest eigenvalue $\lambda 1$ is called the major eigenvector, and aligns with the spatial direction having the highest diffusion coefficient. The medium and smallest eigenvalues $\lambda 2, \lambda 3$ correspond to the medium and minor eigenvectors. The medium and minor eigenvectors are orthogonal to the major eigenvector and align with spatial directions having lower diffusion coefficients. The relative values of the eigenvalues $\lambda 1, \lambda 2, \lambda 3$ are indicative of the spatial orientation and magnitude of the diffusion tensor anisotropy.

As shown in FIG. 1C, the eigenvectors and eigenvalues are geometrically representable by an ellipsoid 183 whose long axis aligns with the major eigenvector e1, i.e. with the direction of the highest apparent diffusion coefficient. The deviation of the ellipsoid 183 from a perfect sphere is representative of the anisotropy of the diffusion tensor. An anisotropic diffusion coefficient tensor may reflect the influence of neural fiber bundles 184 which tend to inhibit diffusion in directions partially or totally orthogonal to the fibers 184, e.g. the directions of eigenvectors e2, e3. In contrast, diffusion parallel to the fibers 184, i.e. channeled along the direction of the major eigenvector e1, is enhanced and larger than along the e2, e3 directions.

Generally, the diffusion tensor, D, is a 3 by 3 symmetric positive definite matrix given by:

$$D = \begin{pmatrix} D_{xx} & D_{xy} & D_{xz} \\ D_{xy} & D_{yy} & D_{yz} \\ D_{xz} & D_{yz} & D_{zz} \end{pmatrix} \tag{1A}$$

In the discussion below, the measured (noisy) diffusion-weighted signals are denoted by $s_i$. The diffusion-weighted function evaluated at $\gamma$, is:

$$\hat{s}_i(\gamma) = \exp\left[\sum_{j=1}^{7} W_{ij}\gamma_j\right] \tag{1B}$$

The diffusion-weighted function evaluated at $\gamma(\xi)$ is:

$$\hat{s}_i(\gamma(\xi)) = \exp\left[\sum_{j=1}^{7} W_{ij}\gamma_j(\xi)\right] \tag{1C}$$

where $\gamma$ is the ordinary representation of the diffusion tensor together with the logarithm of the reference signal:

$$\gamma = [\gamma_1 \ \gamma_2 \ \gamma_3 \ \gamma_4 \ \gamma_5 \ \gamma_6 \ \gamma_7]^T \tag{1D}$$
$$= [\ln(s_0) \ D_{xx} \ D_{yy} \ D_{zz} \ D_{xy} \ D_{yz} \ D_{xz}]^T,$$

and $\gamma(\xi)$ is the ordinary representation of the diffusion tensor in terms of the Euler diffusion tensor representation, where the Euler representation of the diffusion tensor is:

$$\xi = [\xi_1 \ \xi_2 \ \xi_3 \ \xi_4 \ \xi_5 \ \xi_6 \ \xi_7]^T \tag{1E}$$
$$= [\ln(s_0) \ \lambda_1 \ \lambda_2 \ \lambda_3 \ \theta \ \phi \ \psi]^T$$

where $s_0$ is the parameter for the non-diffusion weighted signal, $\lambda_1, \lambda_2,$ and $\lambda_3$ denote major, medium, and minor eigenvalues, respectively, and $\theta, \phi,$ and $\psi$ denote Euler angles.

Suppose that $\hat{\gamma}_{NLS}$ is the nonlinear least square estimate of the parameter vector $\gamma$, then the residual vector is a vector whose individual component is the difference between the observed and the expected or estimated signals:

$$r(\hat{\gamma}_{NLS}) = [r_1(\hat{\gamma}_{NLS}) \ldots r_n(\hat{\gamma}_{NLS})]^T, \tag{1F}$$

where $r_i(\hat{\gamma}_{NLS}) = s_i - \hat{s}_i(\hat{\gamma}_{NLS})$ for $i=1, \ldots, n$.

The design matrix, W, is given by:

$$\begin{pmatrix} 1 & -b_1 g_{1x}^2 & -b_1 g_{1y}^2 & -b_1 g_{1z}^2 & -2b_1 g_{1x} g_{1y} & -2b_1 g_{1y} g_{1z} & -2b_1 g_{1x} g_{1z} \\ \vdots & \vdots & \vdots & \vdots & \vdots & \vdots & \vdots \\ 1 & -b_n g_{nx}^2 & -b_n g_{ny}^2 & -b_n g_{nz}^2 & -2b_n g_{nx} g_{ny} & -2b_n g_{ny} g_{nz} & -2b_n g_{nx} g_{nz} \end{pmatrix} \quad (1G)$$

The objective functions for the nonlinear least squares problem in the diffusion tensor imaging (DTI) in the ordinary diffusion tensor representation and Euler diffusion tensor representation may be expressed, respectively:

$$f_{NLS}(\gamma) = \frac{1}{2}\sum_{i=1}^{n}\underbrace{\left(s_i - \exp\left[\sum_{j=1}^{7} W_{ij}\gamma_j\right]\right)^2}_{r_i(\gamma)}, \quad (1H)$$

and $$f_{ENLS}(\gamma(\xi)) = \frac{1}{2}\sum_{i=1}^{n}\underbrace{\left(s_i - \exp\left[\sum_{j=1}^{7} W_{ij}\gamma_j(\xi)\right]\right)^2}_{r_i(\gamma(\xi))}, \quad (2)$$

The covariance matrix $\Sigma_\gamma$ of the ordinary diffusion tensor representation may be defined as:

$$\Sigma_\gamma = \sigma_{DW}^2 [W^T(\hat{S}^2 - R\hat{S})W]^{-1}, \quad (3)$$

The covariance matrix of the Euler diffusion tensor representation may be derived from the covariance matrix of the ordinary diffusion tensor representation as described below. Generally, the covariance matrix $\Sigma_\xi$ of the Euler diffusion tensor representation may be defined as:

$$\Sigma_\xi = \sigma_{DW}^2 [J_\xi^T(\gamma(\hat{\xi}))W^T(\hat{S}^2 - R\hat{S})WJ_\xi(\gamma(\hat{\xi}))]^{-1} \quad (4A)$$

where the matrix or vector transposition is denoted by superscript T,
$J_\xi$ denotes a Jacobian matrix,
S and $\hat{S}$ are diagonal matrices including diagonal elements,
R is a residual matrix, and
$\sigma_{DW}^2$ is the estimated variance.

A first diagonal matrix S includes observed diffusion weighted signals:

$$S = \begin{pmatrix} s_1 & & \\ & \ddots & \\ & & s_n \end{pmatrix} \quad (4B)$$

A second diagonal matrix $\hat{S}$ includes the estimated diffusion weighted signals, respectively:

$$\hat{S} = \begin{pmatrix} \hat{s}_1 & & \\ & \ddots & \\ & & \hat{s}_n \end{pmatrix} \quad (4C)$$

The residual matrix R is equal to a difference between the first and second diagonal matrices:

$$R = S - \hat{S} \quad (4D)$$

The element of the Jacobian matrix, $J_\xi(\gamma)$ may be defined as:

$$[J_\xi(\gamma)]_{ij} \equiv \frac{\partial \gamma_i}{\partial \xi_j}; \text{ and} \quad (4E)$$

The estimated variance $\sigma_{DW}^2$ may be derived from the nonlinear fit (Equation 1H):

$$\sigma_{DW}^2 = 2f_{NLS}(\hat{\gamma}_{NLS})/(n-7). \quad (4F)$$

The core idea of error propagation is to transform one covariance matrix to another covariance matrix of interest through an appropriate mapping between the underlying representations. In DT-MRI, the most fundamental covariance matrix is $\Sigma_\gamma$, from which other covariance matrices may be obtained.

For example, the Euler covariance matrix $\Sigma_\xi$ may be constructed from the ordinary covariance matrix $\Sigma_\gamma$ as follows:

$$\Sigma_\xi = J_\gamma(\xi(\hat{\gamma}))\Sigma_\gamma J_\gamma^T(\xi(\hat{\gamma})), \quad (5)$$

where $J_\gamma(\xi(\hat{\gamma}))$, $$[J_\xi(\xi(\hat{\gamma}))]_{ij} \equiv \frac{\partial \xi_i(\gamma)}{\partial \gamma_j}\bigg|_{\gamma=\hat{\gamma}},$$

is the Jacobian matrix of $\xi$ with respect to $\gamma$ evaluated at $\hat{\gamma}$.

The Jacobian matrix is a locally linear map from $d\gamma$ to $d\xi$ at $\hat{\gamma}$:

$$d\xi = J_\gamma(\xi(\hat{\gamma}))d\gamma \quad (6A)$$

As shown, the Jacobian matrix between representations plays a critical role in transforming one covariance matrix to another and the Jacobian matrix is, in turn, dependent upon the mapping between representations.

Equations (5) and (4A) are equivalent in principle. For example, equation (4A) may be derived by substituting equation (3) into equation (5):

$$\begin{aligned} \Sigma_\xi &= J_\gamma(\xi(\hat{\gamma}))\Sigma_\gamma J_\gamma^T(\xi(\hat{\gamma})) \\ &= \sigma_{DW}^2 J_\gamma(\xi(\hat{\gamma}))\left[W^T(\hat{S}^2 - R\hat{S})W\right]^{-1} J_\gamma^T(\xi(\hat{\gamma})) \\ &= \sigma_{DW}^2 (J_\gamma(\xi(\hat{\gamma})))^{(-1)(-1)}\left[W^T(\hat{S}^2 - R\hat{S})W\right]^{-1} (J_\gamma^T(\xi(\hat{\gamma})))^{(-1)(-1)} \\ &= \sigma_{DW}^2 \left[(J_\gamma^T(\xi(\hat{\gamma})))^{-1}\left(W^T(\hat{S}^2 - R\hat{S})W\right)(J_\gamma(\xi(\hat{\gamma})))^{-1}\right]^{-1} \\ &= \sigma_{DW}^2 \left[J_\xi^T(\gamma(\hat{\xi}))W^T(\hat{S}^2 - R\hat{S})WJ_\xi(\gamma(\hat{\xi}))\right]^{-1} \end{aligned}$$

In the above derivation, the following well-known identity is used:

$$J_\xi(\gamma(\hat{\xi}))\cdot J_\gamma(\xi(\hat{\gamma})) = J_\xi(\xi(\hat{\xi})) = I \quad (6B)$$

Therefore:

$$[J_\gamma(\xi(\hat{\gamma}))]^{-1} = J_\xi(\gamma(\hat{\xi})) \quad (6C)$$

In practice, it is easier to compute $J_\xi(\gamma(\hat{\xi}))$ than $J_\gamma(\xi(\hat{\gamma}))$. An explicit mapping between representations is usually needed to construct the Jacobian matrix. Occasionally, such a mapping may not exist or may be too complicated to shed light on the problem at hand. If this is the case then the first order matrix perturbation method may be helpful in finding the Jacobian matrix in the form of $d\xi = J_\gamma(\xi(\hat{\gamma}))d\gamma$ without requiring an explicit mapping $\xi(\gamma)$.

The covariance matrix determining engine 164 may construct an ordinary covariance matrix 185 of the major eigenvector based on the nonlinear least squares method by using a reformulated first order matrix perturbation method. A notation, $a(\cdot,\cdot)$ is used below to simplify the discussion.

Let $$Q = \begin{pmatrix} Q_{11} & Q_{12} & Q_{13} \\ Q_{21} & Q_{22} & Q_{23} \\ Q_{31} & Q_{32} & Q_{33} \end{pmatrix}, \quad (7A)$$

$$q_1 = \begin{pmatrix} q_{1x} \\ q_{1y} \\ q_{1z} \end{pmatrix} = \begin{pmatrix} Q_{11} \\ Q_{21} \\ Q_{31} \end{pmatrix}, \quad (7B)$$

$$q_2 = \begin{pmatrix} q_{2x} \\ q_{2y} \\ q_{2z} \end{pmatrix} = \begin{pmatrix} Q_{12} \\ Q_{22} \\ Q_{32} \end{pmatrix}, \quad (7C)$$

and $$q_3 = \begin{pmatrix} q_{3x} \\ q_{3y} \\ q_{3z} \end{pmatrix} = \begin{pmatrix} Q_{13} \\ Q_{23} \\ Q_{33} \end{pmatrix}, \quad (7D)$$

where $q_1$, $q_2$ and $q_3$ are major, medium and minor eigenvectors, respectively.

The quadratic form, $q_i^T \cdot D \cdot q_j$, as a dot product between two vectors, may be presented by:

$$q_i^T \cdot D \cdot q_j = a(q_i, q_j)^T \cdot \beta \quad (7E)$$

where $$a(q_i, q_j)^T = [q_{ix}q_{jx}\ q_{iy}q_{jy}\ q_{iz}q_{jz}\ q_{ix}q_{jy}+q_{iy}q_{jx}\ q_{iy}q_{jz}+q_{iz}q_{jy}\ q_{ix}q_{jz}+q_{iz}q_{jx}] \quad (8)$$

and $$\beta = [D_{xx}\ D_{yy}\ D_{zz}\ D_{xy}\ D_{yz}\ D_{xz}]. \quad (9)$$

The first order matrix perturbation method begins, respectively, with the eigenvalue equation and the orthonormality condition:

$$D \cdot q_i = \lambda_i q_i, \quad (10)$$

and $$q_i^T q_j = \delta_{ij}, \quad (11)$$

where $\delta_{ij}$ is the Kronecker delta function, which assumes unity if $i=j$ or is equal to zero otherwise.

Assuming a small variation on both sides of equation (10), e.g. $\delta(D \cdot q_i) = \delta(\lambda_i q_i)$:

$$\delta D \cdot q_i + D \cdot \delta q_i = \delta \lambda_i q_i + \lambda_i \delta q_i \text{ for } i, j=1,2,3 \quad (12)$$

Assuming a small variation on both sides of equation (11), e.g. $\delta(q_i^T q_j) = \delta(\delta_{ij})$:

$$\delta q_i^T \cdot q_j + q_i^T \cdot \delta q_j = \delta(\delta_{ij}) = 0 \text{ for } i, j=1,2,3 \quad (13)$$

Equation (13) implies that:

$$\delta q_i^T \cdot q_j = -q_i^T \cdot \delta q_j \text{ for } i \neq j, \quad (14)$$

If $q_i^T q_i = 1$:

$$q_i^T \cdot \delta q_i = 0 \text{ or } \delta q_i^T \cdot q_i = 0 \text{ for } i=1,2,3 \quad (15)$$

Taking the dot product between equation (12) with $q_j^T$:

$$q_j^T \cdot \delta D \cdot q_i + q_j^T \cdot D \cdot \delta q_i = \delta \lambda_i \underbrace{q_j^T \cdot q_i}_{0} + \lambda_i q_j^T \cdot \delta q_i, \quad (16)$$

$$q_j^T \cdot \delta D \cdot q_i + (D^T \cdot q_j)^T \cdot \delta q_i = \lambda_i q_j^T \cdot \delta q_i.$$

Since the diffusion tensor D is symmetric, equation (16) may be further reduced by taking into account equation (10):

$$q_j^T \cdot \delta D \cdot q_i + \lambda_j \cdot q_j^T \cdot \delta q_i = \lambda_i q_j^T \cdot \delta q_i, \quad (17)$$

$$q_j^T \cdot \delta q_i = \frac{1}{(\lambda_i - \lambda_j)} q_j^T \cdot \delta D \cdot q_i, \quad (18)$$

$$q_j^T \cdot \delta q_i = \frac{1}{(\lambda_i - \lambda_j)} a(q_j, q_i)^T \cdot \delta \beta$$

Although equation (18) differs from equation (6A) defining the transformation relationship between $\gamma$ and $\zeta$ via the Jacobian matrix, equation (18) may be reformulated to achieve the form of equation (6), e.g. $\delta q_i = J_\beta(q_i)\delta\beta$.

Assuming that the relationship between the eigenvalues is $\lambda_1 > \lambda_2 > \lambda_3$, and solving for the dispersion of the major eigenvector $q_1$, e.g., $i=1$, equation (18) results in equations (19)-(21). Equation (19) may be derived from equation (15):

$$q_1^T \cdot \delta q_1 = [0\ 0\ 0\ 0\ 0\ 0] \cdot \delta\beta \quad (19)$$

Equations (20)-(21) may be derived from equations (17)-(18):

$$q_2^T \cdot \delta q_1 = \frac{1}{(\lambda_1 - \lambda_2)} a(q_2, q_1)^T \cdot \delta\beta, \quad (20)$$

$$q_3^T \cdot \delta q_1 = \frac{1}{(\lambda_1 - \lambda_3)} a(q_3, q_1)^T \cdot \delta\beta. \quad (21)$$

Equations (19-21) may be combined into a single matrix expression:

$$\underbrace{\begin{pmatrix} q_1^T \\ q_2^T \\ q_3^T \end{pmatrix}}_{Q^T} \cdot \delta q_1 = \underbrace{\begin{pmatrix} 0 & 0 & 0 & 0 & 0 & 0 \\ \frac{1}{(\lambda_1 - \lambda_2)} a(q_2, q_1)^T \\ \frac{1}{(\lambda_1 - \lambda_3)} a(q_3, q_1)^T \end{pmatrix}}_{S_1} \cdot \delta\beta, \quad (22)$$

or $$Q^T \cdot \delta q_1 = S_1 \cdot \delta\beta,$$

or $$\delta q_1 = Q \cdot S_1 \cdot \delta\beta.$$

In the above derivation, the orthonormality condition is used, e.g. $QQ^T = I$. The dispersions of the medium and minor eigenvectors may be similarly derived.

The above reformulation based on $\beta$ may be extended to $\gamma$ resulting in:

$$\delta q_1 = Q \cdot T_1 \cdot \delta\gamma \quad (23A)$$

where $T_1$ is a 3×7 matrix given by $$T_1 = \begin{pmatrix} 0 & 0 & 0 & 0 & 0 & 0 & 0 \\ 0 & \frac{1}{(\lambda_1 - \lambda_2)} a(q_2, q_1)^T \\ 0 & \frac{1}{(\lambda_1 - \lambda_3)} a(q_3, q_1)^T \end{pmatrix} \quad (23B)$$

In terms of the Jacobian matrix for $\beta$:

$$Q \cdot S_1 = J_\beta(q_1) \quad (24)$$

In terms of the Jacobian matrix for $\gamma$:

$$Q \cdot T_1 = J_\gamma(q_1) \quad (25)$$

Finally, the covariance matrix $\Sigma_{q_1}$ of the major eigenvector $q_1$ obtained via the reformulated first order matrix perturbation method may be determined as:

$$\Sigma_{q_1}(\hat{\gamma}) = J_\gamma(q_1)\Sigma_\gamma(\hat{\gamma})J_\gamma^T(q_1) \quad (26)$$

Optionally or alternatively, the covariance matrix $\Sigma_{q_1}$ derived in equation (26) may be derived based on the error propagation method, known in the art. The covariance matrix of the major eigenvector of the diffusion tensor using the Euler diffusion tensor representation is:

$$\Sigma_{q_1} = J_\xi(q_1(\hat{\xi}))\Sigma_\xi J_\xi^T(q_1(\hat{\xi})), \quad (27)$$

Substituting equation (4A) into equation (27) results in:

$$\Sigma_{q_1} = \sigma_{DW}^2 J_\xi(q_1(\hat{\xi}))[J_\xi^T(\gamma(\hat{\xi}))W^T(\hat{S}^2 - R\hat{S})WJ_\xi(\gamma(\hat{\xi}))]^{-1} J_\xi^T(q_1(\hat{\xi})) \quad (28A)$$

$$\Sigma_{q_1} = J_\xi(q_1(\hat{\xi}))[J_\xi(\gamma(\hat{\xi}))]^{-1}$$

$$\underbrace{\sigma_{DW}^2[W^T(\hat{S}^2 - R\hat{S})W]^{-1}}_{\Sigma_\gamma}[J_\xi^T(\gamma(\hat{\xi}))]^{-1} J_\xi^T(q_1(\hat{\xi}))$$

$$\Sigma_{q_1} = J_\xi(q_1(\hat{\xi}))J_\gamma(\xi(\hat{\gamma}))\Sigma_\gamma J_\gamma^T(\xi(\hat{\gamma}))J_\xi^T(q_1(\hat{\xi}))$$

$$\Sigma_{q_1} = J_\gamma(q_1(\hat{\gamma}))\Sigma_\gamma J_\gamma^T(q_1(\hat{\gamma}))$$

where $J_\xi(q_1(\hat{\xi}))J_\gamma(\xi(\hat{\gamma})) = J_\gamma(q_1(\hat{\gamma}))$, and $$[J_\xi(\gamma(\hat{\xi}))]^{-1} = J_\gamma(\xi(\hat{\gamma})).$$

Jacobian matrix $J_\gamma(q_1(\hat{\gamma}))$ may be constructed as described above.

In one embodiment, the cone of uncertainty determining engine 170 may construct the elliptical cone of uncertainty as follows. From equation (28A), the $1-\alpha$ confidence region for the major eigenvector $q_1$ is an ellipsoid given by:

$$(q_1 - q_1(\hat{\gamma}))^T \Sigma_{q_1}^+(\hat{\gamma})(q_1 - q_1(\hat{\gamma})) \leq 2\,\mathcal{F}_{(2,n-7;\alpha)} \quad (28B)$$

where $\mathcal{F}(2,n-7;\alpha)$ is the upper $\alpha$ quantile for an $\mathcal{F}$ distribution with 2 and n–7 degrees of freedom.

The plus sign on $\Sigma_{q_1}^+$ denotes the matrix pseudoinverse which is needed because the matrix rank of $\Sigma_{q_1}$ is two rather than three.

Equivalently:

$$(q_1 - q_1(\hat{\gamma}))^T (2\,\mathcal{F}_{(2,n-7;\alpha)}\Sigma_{q_1}(\hat{\gamma}))^+(q_1 - q_1(\hat{\gamma})) \leq 1 \quad (28C)$$

Because the eigenvectors of the diffusion tensor are orthogonal and the eigenvectors of $\Sigma_{q_1}(\hat{\gamma})$ are the singular vectors, equation (28C) may be simplified:

$$q_1^T(2\,\mathcal{F}_{(2,n-7;\alpha)}\Sigma_{q_1}(\hat{\gamma}))^+ q_1 \leq 1 \quad (28D)$$

Let the eigenvalue decomposition of $\Sigma_{q_1}(\hat{\gamma})$ be:

$$\Sigma_{q_1}(\hat{\gamma}) = \omega_1 c_1 c_1^T + \omega_2 c_2 c_2^T + 0 q_1(\hat{\gamma}) q_1^T(\hat{\gamma}), \quad (28E)$$

where the last term is due to $Q \cdot T_1 = J_\gamma(q_1)$ and equation (26).

The principal directions of the ellipse of the COU whose area corresponds to the $1-\alpha$ joint confidence region for the major eigenvector $q_1$ may be found by selecting $q_1$ to be equal to one of:

$$\sqrt{2\,\mathcal{F}_{(2,n-7;\alpha)\omega_1}}\,c_1 \text{ or } \sqrt{2\,\mathcal{F}_{(2,n-7;\alpha)\omega_2}}\,c_2 \quad (28F)$$

The term $\mathcal{F}(2,n-7;\alpha)$ may be found by solving equation (28G):

$$\alpha - I_{(n-7)/(n-7+2\mathcal{F})}((n-7)/2,\,1) = 0 \quad (28G)$$

where $I_x(a,b)$ is the incomplete Beta function.

Figure 2:
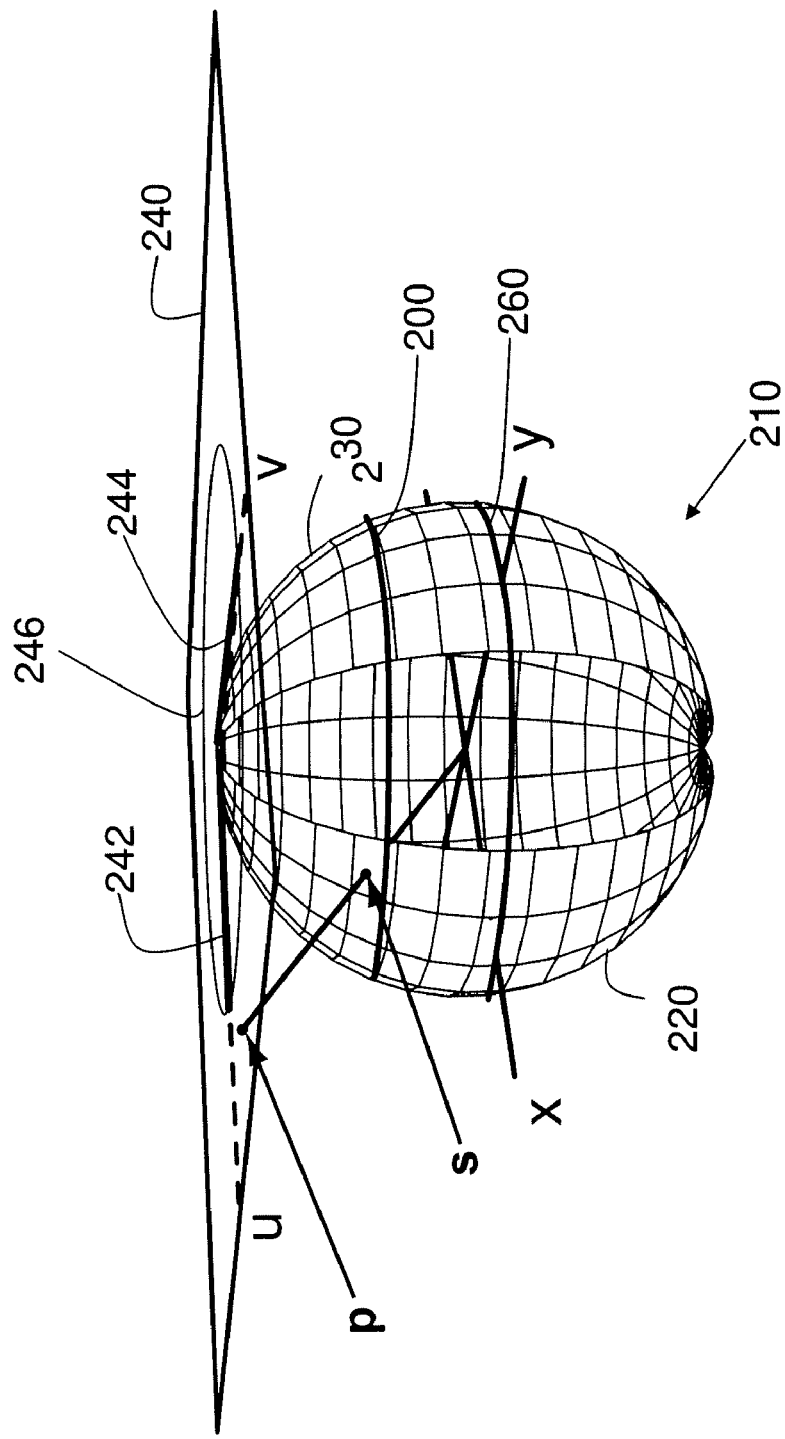
FIG. 2 illustrates a Gnomonic projection according to an exemplary embodiment of the invention.

With continuing reference to FIGS. 1A and 1B and further reference to FIG. 2, the first normalized measure determining engine 170 may determine the normalized first or areal measure $\Gamma$. More specifically, a simple closed or Jordan curve 200 on the unit sphere 210 divides the unit sphere into first and second regions 220, 230. For example, the first region 220 is greater than the second region 230. The first normalized measure determining engine 172 may determine the normalized areal measure $\Gamma$ as a ratio of an area of the second, smaller region 230 on the unit sphere, that is enclosed by the simple closed curve 200 whose Gnomonic or central projection is on the u, v-plane 240, to an area of a hemisphere.

Let s be a point on an upper hemisphere whose Gnomonic projection on the u, v-plane 240 is the point p. Let p be denoted in a vector form by:

$$p = \begin{pmatrix} u \\ v \\ 1 \end{pmatrix} \quad (29)$$

The point s in a vector form may be obtained by normalizing p to a unit length:

$$s \equiv \begin{pmatrix} X_s \\ Y_s \\ Z_s \end{pmatrix} = \frac{p}{\sqrt{p^T \cdot p}} = \begin{pmatrix} \dfrac{u}{\sqrt{u^2+v^2+1}} \\ \dfrac{v}{\sqrt{u^2+v^2+1}} \\ \dfrac{1}{\sqrt{u^2+v^2+1}} \end{pmatrix} \quad (30A)$$

Therefore, the components of s are functions of u and v.

Suppose that major and minor axes 242, 244 of the ellipse 246 coincide with the u and the v axes of the u, v-plane. Analogously to equation (28F), let a length of the major and the minor axes 242, 244 be a and b, respectively, where:

$$a = \sqrt{2\,\mathcal{F}_{(2,n-7;\alpha)\omega_1}} \text{ and} \quad (30B)$$

$$b = \sqrt{2\,\mathcal{F}_{(2,n-7;\alpha)\omega_2}} \quad (30C)$$

The normalized areal measure, $\Gamma$, which is a dimensionless quantity, has a range of values from zero to unity:

$$\Gamma = \frac{1}{2\pi} \int\!\!\int_R \sqrt{EG - F^2}\, du\, dv \quad (31A)$$

where R is the smaller region 230.

A region R may be is defined by:

$$(u/a)^2 + (v/b)^2 \leq 1 \quad (31B)$$

The coefficients of the first fundamental form are:

$$E = \left(\frac{\partial X_s}{\partial u}\right)^2 + \left(\frac{\partial Y_s}{\partial u}\right)^2 + \left(\frac{\partial Z_s}{\partial u}\right)^2, \quad (31C)$$

-continued $$G = \left(\frac{\partial X_s}{\partial v}\right)^2 + \left(\frac{\partial Y_s}{\partial v}\right)^2 + \left(\frac{\partial Z_s}{\partial v}\right)^2, \quad (31D)$$

and $$F = \frac{\partial X_s}{\partial u}\frac{\partial X_s}{\partial v} + \frac{\partial Y_s}{\partial u}\frac{\partial Y_s}{\partial v} + \frac{\partial Z_s}{\partial u}\frac{\partial Z_s}{\partial v}. \quad (31E)$$

The surface integral of equation (31A) may be simplified to show explicit dependence on a and b. First, several preliminary expressions are evaluated:

$$\frac{\partial X_s}{\partial u} = \frac{1+v^2}{(u^2+v^2+1)^{3/2}}, \quad (31F)$$

$$\frac{\partial X_s}{\partial v} = \frac{uv}{(u^2+v^2+1)^{3/2}} = \frac{\partial Y_s}{\partial u}, \quad (31G)$$

$$\frac{\partial Y_s}{\partial v} = \frac{1+u^2}{(u^2+v^2+1)^{3/2}}, \quad (31H)$$

$$\frac{\partial Z_s}{\partial u} = -\frac{u}{(u^2+v^2+1)^{3/2}}, \quad (31I)$$

$$\frac{\partial Z_s}{\partial v} = -\frac{v}{(u^2+v^2+1)^{3/2}}; \quad (31J)$$

$$E = \left(\frac{\partial X_s}{\partial u}\right)^2 + \left(\frac{\partial Y_s}{\partial u}\right)^2 + \left(\frac{\partial Z_s}{\partial u}\right)^2 = \frac{1+v^2}{(u^2+v^2+1)^2}, \quad (31K)$$

$$G = \left(\frac{\partial X_s}{\partial v}\right)^2 + \left(\frac{\partial Y_s}{\partial v}\right)^2 + \left(\frac{\partial Z_s}{\partial v}\right)^2 = \frac{1+u^2}{(u^2+v^2+1)^2}, \quad (31L)$$

and $$F = \frac{\partial X_s}{\partial u}\frac{\partial X_s}{\partial v} + \frac{\partial Y_s}{\partial u} + \frac{\partial Z_s}{\partial u}\frac{\partial Z_s}{\partial v} = -\frac{uv}{(u^2+v^2+1)^2}. \quad (31M)$$

The integrand of equation (31A) is then given by:

$$\sqrt{EG - F^2} = \sqrt{\frac{(1+v^2)(1+u^2)}{(u^2+v^2+1)^4} - \frac{u^2v^2}{(u^2+v^2+1)^4}} \quad (31N)$$

$$= \frac{1}{(u^2+v^2+1)^{3/2}}$$

Therefore, $$\Gamma = \frac{1}{2\pi}\int\int_R \frac{1}{(u^2+v^2+1)^{3/2}}\,du\,dv \quad (31O)$$

where R is the region defined by $(u/a)^2+(v/b)^2 \leq 1$.

By a change of variables, $u = a\xi_x$ and $v = b\xi_x$:

$$\Gamma = \frac{ab}{2\pi}\int\int_{R_1} \frac{1}{(1+a^2\xi_x^2+b^2\xi_y^2)^{3/2}}\,d\xi_x d\xi_y \quad (31P)$$

where $R_1$ is a circular region (or a disk) defined by $\xi_x^2+\xi_y^2 \leq 1$ The limits of integration due to the circular region $R_1$ may be introduced into $\Gamma$ and the integral is now given by:

$$\Gamma = \frac{ab}{2\pi}\int_{-1}^{1}\int_{-\sqrt{1-\xi_y^2}}^{\sqrt{1-\xi_y^2}} \frac{1}{(1+a^2\xi_x^2+b^2\xi_y^2)^{3/2}}\,d\xi_x d\xi_y \quad (31Q)$$

In equation (31Q), the term $a^2$ may be factored and $\beta^2$ may be defined as:

$$\beta^2 \equiv \frac{1}{a^2} + \frac{b^2}{a^2}\xi_y^2 \quad (31R)$$

The inner integral of equation (31Q) becomes:

$$\int \frac{1}{(\beta^2+\xi^2)^{3/2}}\,d\xi \quad (31S)$$

The integral of equation (31S) may be evaluated as described below. Define $$T = \xi(\beta^2+\xi^2)^{-\frac{m}{2}+1} \quad (31T)$$

The derivative of T with respect to $\xi$ is given by:

$$\frac{dT}{d\xi} = (\beta^2+\xi^2)^{-\frac{m}{2}+1} - \xi^2(m-2)(\beta^2+\xi^2)^{-\frac{m}{2}} \quad (31U)$$

$$= (\beta^2+\xi^2)^{-\frac{m}{2}+1} - ((\beta^2+\xi^2)-\beta^2)(m-2)(\beta^2+\xi^2)^{-\frac{m}{2}}$$

$$= (\beta^2+\xi^2)^{-\frac{m}{2}+1} - (m-2)(\beta^2+\xi^2)^{-\frac{m}{2}+1} +$$

$$\beta^2(m-2)(\beta^2+\xi^2)^{-\frac{m}{2}}$$

$$= (3-m)(\beta^2+\xi^2)^{-\frac{m}{2}+1} + \beta^2(m-2)(\beta^2+\xi^2)^{-\frac{m}{2}}.$$

Rearranging $\beta^2(m-2)$ in equation (31U):

$$(\beta^2+\xi^2)^{-\frac{m}{2}} = \frac{(3-m)}{\beta^2(m-2)}\int(\beta^2+\xi^2)^{-\frac{m}{2}+1} + \frac{1}{\beta^2(m-2)}\frac{dT}{d\xi} \quad (31V)$$

Therefore, $$\int(\beta^2+\xi^2)^{-\frac{m}{2}}\,d\xi = \quad (31W)$$

$$\frac{(3-m)}{\beta^2(m-2)}\int(\beta^2+\xi^2)^{-\frac{m}{2}+1}\,d\xi + \frac{1}{\beta^2(m-2)}\xi(\beta^2+\xi^2)^{-\frac{m}{2}+1}$$

or $$\int(\beta^2+\xi^2)^{-\frac{3}{2}}\,d\xi = \frac{1}{\beta^2}\xi(\beta^2+\xi^2)^{\frac{1}{2}}.$$

In one embodiment, for a faster approach, a trigonometric substitution of $\tan\theta = \xi/\beta$ may be used.

The areal measure $\Gamma$:

$$\Gamma = \frac{b}{2\pi a^2} \int_{-1}^{1} \left[ \frac{1}{\beta^2} \xi_x (\beta^2 + \xi_x^2)^{-\frac{1}{2}} \right]_{\xi_x=-\sqrt{1-\xi_y^2}}^{\xi_x=+\sqrt{1-\xi_y^2}} d\xi_y,$$

$$= \frac{b}{\pi a^2} \int_{-1}^{1} \left[ \frac{1}{\beta^2} \sqrt{1-\xi_y^2} \, (\beta^2 + 1 - \xi_y^2)^{-\frac{1}{2}} \right] d\xi_y,$$

$$= \frac{ab}{\pi} \int_{-1}^{1} \left[ \frac{\sqrt{1-\xi_y^2}}{1+b^2\xi_y^2} \frac{1}{(1+b^2\xi_y^2 + a^2 - a^2\xi_y^2)^{1/2}} \right] d\xi_y,$$

$$= \frac{2ab}{\pi} \int_0^1 \left[ \frac{\sqrt{1-\xi_y^2}}{1+b^2\xi_y^2} \frac{1}{(1+b^2\xi_y^2 + a^2 - a^2\xi_y^2)^{1/2}} \right] d\xi_y,$$

since the integrand is an even function, $$= \frac{2ab}{\pi\sqrt{1+a^2}} \int_0^1 \left[ \frac{1-\xi_y^2}{1+b^2\xi_y^2} \frac{1}{(1-\xi_y^2)^{1/2} \left(1 - \frac{a^2-b^2}{1+a^2}\xi_y^2\right)^{1/2}} \right] d\xi_y \quad (31X)$$

The integral I of equation (31X) may be expressed in terms of the complete elliptic integrals of the first and third kinds.
Define:

$$d_1 = \frac{1}{1+b^2\xi_y^2} \frac{1}{(1-\xi_y^2)^{1/2} \left(1 - \frac{a^2-b^2}{1+a^2}\xi_y^2\right)^{1/2}} \quad (31Y)$$

and $$d_2 = \frac{1}{(1-\xi_y^2)^{1/2} \left(1 - \frac{a^2-b^2}{1+a^2}\xi_y^2\right)^{1/2}}; \quad (31Z)$$

then:

$$K\left(\frac{a^2-b^2}{1+a^2}\right) = \int_0^1 \frac{1}{d_2} d\xi_y \quad (31AA)$$

and $$\Pi\left(-b^2, \frac{a^2-b^2}{1+a^2}\right) = \int_0^1 \frac{1}{d_1} d\xi_y \quad (31BB)$$

Therefore, the integral I may be expressed in two formats as shown in equations (31CC) and (31DD):

$$I = \int_0^1 \left[ \frac{1-\xi_y^2}{1+b^2\xi_y^2} \frac{1}{d_2} \right] d\xi_y \quad (31CC)$$

$$I = \int_0^1 \left[ \frac{1-\xi_y^2}{d_1} \right] d\xi_y \quad (31DD)$$

For the integral I of equation (31CC):

$$I = \int_0^1 \left[ \frac{1-\xi_y^2 + b^2\xi_y^2 - b^2\xi_y^2}{1+b^2\xi_y^2} \frac{1}{d_2} \right] d\xi_y, \quad (31EE)$$

$$= \int_0^1 \left[ \frac{1+b^2\xi_y^2 - (1+b^2)\xi_y^2}{1+b^2\xi_y^2} \frac{1}{d_2} \right] d\xi_y,$$

$$= \int_0^1 \frac{1}{d_2} d\xi_y - (1+b^2) \int_0^1 \frac{\xi_y^2}{d_1} d\xi_y,$$

$$= K\left(\frac{a^2-b^2}{1+a^2}\right) - (1+b^2) \int_0^1 \frac{\xi_y^2}{d_1} d\xi_y$$

For the integral I of equation (31DD):

$$I = \int_0^1 \left[ \frac{1-\xi_y^2}{d_1} \right] d\xi_y = \int_0^1 \frac{1}{d_1} d\xi_y - \int_0^1 \frac{\xi_y^2}{d_1} d\xi_y \quad (31FF)$$

$$= \Pi\left(-b^2, \frac{a^2-b^2}{1+a^2}\right) - \int_0^1 \frac{\xi_y^2}{d_1} d\xi_y.$$

Since the expressions (31EE) and (31FF) are equivalent, the expressions (31EE) and (31FF) may be equated:

$$K\left(\frac{a^2-b^2}{1+a^2}\right) - (1+b^2) \int_0^1 \frac{\xi_y^2}{d_1} d\xi_y = \quad (31GG)$$

$$\Pi\left(-b^2, \frac{a^2-b^2}{1+a^2}\right) - \int_0^1 \frac{\xi_y^2}{d_1} d\xi_y$$

or $$\int_0^1 \frac{\xi_y^2}{d_1} d\xi_y = -\frac{1}{b^2} \left( \Pi\left(-b^2, \frac{a^2-b^2}{1+a^2}\right) - K\left(\frac{a^2-b^2}{1+a^2}\right) \right) \quad (31HH)$$

The integral, I, may be expressed in terms of K and $\Pi$:

$$I = \Pi\left(-b^2, \frac{a^2-b^2}{1+a^2}\right) - \int_0^1 \frac{\xi_y^2}{d_1} d\xi_y \quad (31II)$$

$$= \Pi\left(-b^2, \frac{a^2-b^2}{1+a^2}\right) +$$

$$\frac{1}{b^2} \left( \Pi\left(-b^2, \frac{a^2-b^2}{1+a^2}\right) - K\left(\frac{a^2-b^2}{1+a^2}\right) \right)$$

$$= \left(1 + \frac{1}{b^2}\right) \Pi\left(-b^2, \frac{a^2-b^2}{1+a^2}\right) - \frac{1}{b^2} K\left(\frac{a^2-b^2}{1+a^2}\right)$$

The areal measure $\Gamma$ may be found from equations (31X) and (31II) as:

$$\Gamma = \frac{2ab}{\pi\sqrt{1+a^2}} \left( \begin{array}{c} \left(1 + \frac{1}{b^2}\right) \Pi\left(-b^2, \frac{a^2-b^2}{1+a^2}\right) - \\ \frac{1}{b^2} K\left(\frac{a^2-b^2}{1+a^2}\right) \end{array} \right) \quad (32A)$$

or $$\Gamma = \frac{2a}{\pi b\sqrt{1+a^2}} \left[ (1+b^2) \Pi\left(-b^2, \frac{a^2-b^2}{1+a^2}\right) - K\left(\frac{a^2-b^2}{1+a^2}\right) \right],$$

where K and Π are, respectively, the complete elliptic integrals of the first kind and the third kind.

The elliptic integral K of the first kind may be defined as:

$$K(m) = \int_0^{\pi/2} \frac{1}{\sqrt{1 - m\sin^2\theta}} d\theta \qquad (32B)$$

$$= \int_0^1 \frac{1}{\sqrt{(1-v^2)(1-mv^2)}} dv$$

The elliptic integral Π of the third kind may be defined as:

$$\Pi(n, m) = \int_0^{\pi/2} \frac{1}{(1 - n\sin^2\theta)\sqrt{1 - m\sin^2\theta}} d\theta \qquad (32C)$$

$$= \int_0^1 \frac{1}{(1-nv^2)(1-mv^2)} dv$$

In one embodiment, where the ellipse on the u, v-plane is becomes a circle, e.g., r≡a=b, the normalized areal measure is:

$$\Gamma = 1 - \frac{1}{\sqrt{1+r^2}}. \qquad (33)$$

A normalized areal measure map engine 177 may construct a normalized areal measure map based on the determined normalized areal measure of an area of interest. The constructed normalized areal measurement map may be used by the rendering engine 176 to generate a human-viewable display of an image of uncertainty which may be displayed on the display 180.

Figure 3:
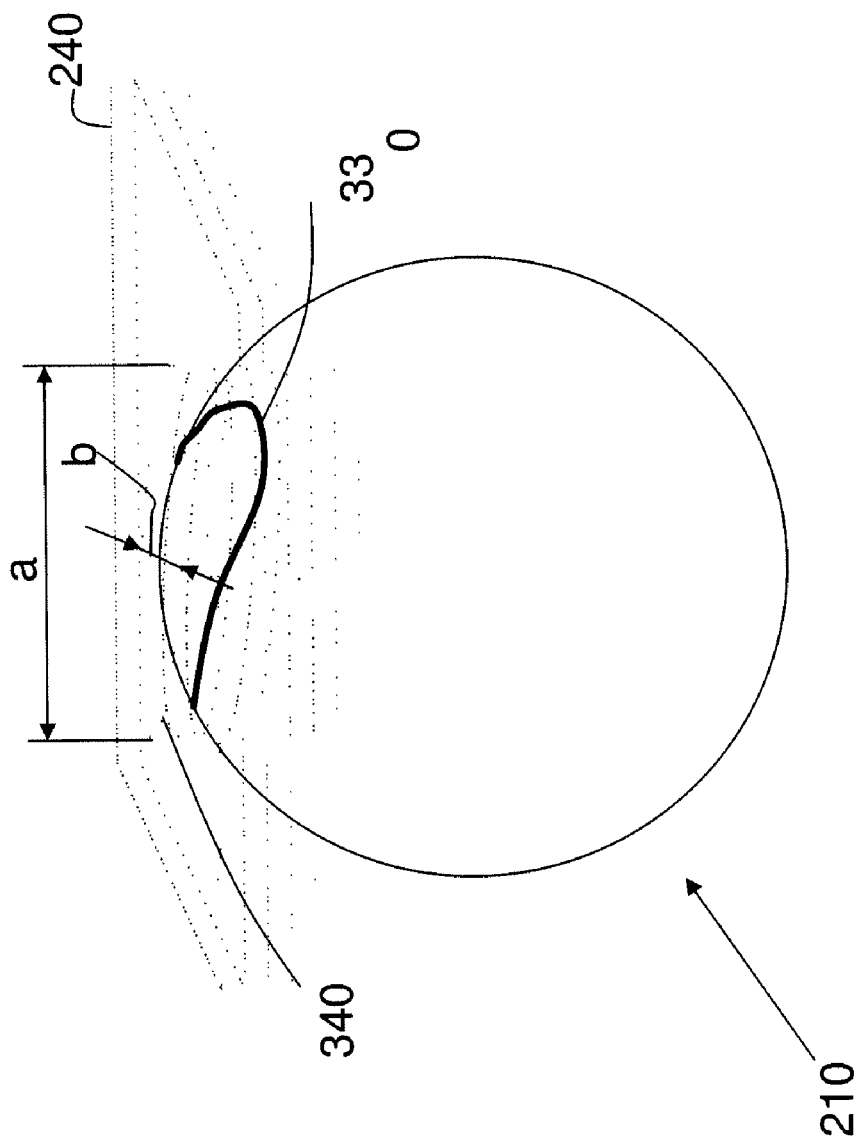
FIG. 3 illustrates an inverse Gnomonic projection according to an exemplary embodiment of the invention.

With continuing reference to FIGS. 1B and 2 and further reference to FIG. 3, the second normalized measure determining engine 174 may determine the normalized second or circumferential measure as a ratio of the circumference of the simple closed curve 200 on the unit sphere 210 to the circumference of a great circle 260 of the unit sphere 210. As explained in detail below, the normalized circumference of a simple closed curve on the sphere may be expressed in terms of the complete elliptical integrals of the first and third kinds. More specifically, the normalized circumference of an inverse projected curve 330 on the unit sphere 210 may be determined as:

$$\Lambda = \frac{1}{2\pi} \int_0^{2\pi} \sqrt{\frac{dX_s(\theta)}{d(\theta)^2} + \left(\frac{dY_s(\theta)}{d\theta}\right)^2 + \left(\frac{dZ_s(\theta)}{d\theta}\right)^2} d\theta \qquad (34A)$$

The 2π term in the denominator is the normalization factor of the circumference of the great circle of the unit sphere. The components of the vector, s, may be parameterized in terms of a, b, and θ:

$$s(\theta) \equiv \begin{pmatrix} X_s(\theta) \\ Y_s(\theta) \\ Z_s(\theta) \end{pmatrix} = \begin{pmatrix} \frac{a\cos(\theta)}{\sqrt{(a\cos(\theta))^2 + (b\sin(\theta))^2 + 1}} \\ \frac{b\sin(\theta)}{\sqrt{(a\cos(\theta))^2 + (b\sin(\theta))^2 + 1}} \\ \frac{1}{\sqrt{(a\cos(\theta))^2 + (b\sin(\theta))^2 + 1}} \end{pmatrix} \qquad (34B)$$

Equation (34A) may be further simplified and expressed in terms of the complete elliptic integrals of the first and third kinds. Provided here are several preliminary expressions:

$$\left(\frac{dX_s(\theta)}{d\theta}\right)^2 = \frac{a^2(1+b^2)^2\sin^2(\theta)}{[1+a^2-(a^2-b^2)\sin^2(\theta)]^3} \qquad (34C)$$

$$\left(\frac{dY_s(\theta)}{d\theta}\right)^2 = \frac{b^2(1+a^2)^2\cos^2(\theta)}{[1+a^2-(a^2-b^2)\sin^2(\theta)]^3} \qquad (34D)$$

$$\left(\frac{dZ_s(\theta)}{d\theta}\right)^2 = \frac{(b^2-a^2)^2\sin^2(\theta)\cos^2(\theta)}{[1+a^2-(a^2-b^2)\sin^2(\theta)]^3} \qquad (34E)$$

$$\Phi \equiv \left(\frac{dX_s(\theta)}{d\theta}\right)^2 + \left(\frac{dY_s(\theta)}{d\theta}\right)^2 + \left(\frac{dZ_s(\theta)}{d\theta}\right)^2 \qquad (34F)$$

$$\Phi = \frac{a^2(1+b^2)^2\sin^2(\theta) + b^2(1+a^2)^2\cos^2(\theta) + (b^2-a^2)^2\sin^2(\theta)\cos^2(\theta)}{[1+a^2-(a^2-b^2)\sin^2(\theta)]^3} \qquad (34E)$$

Equation (34E) may be expressed as:

$$\Phi = \frac{(b^2(1+a^2) + (a^2-b^2)\sin^2(\theta))(1+a^2-(a^2-b^2)\sin^2(\theta))}{[1+a^2-(a^2-b^2)\sin^2(\theta)]^3} \qquad (34F)$$

The square root of Φ may be written as:

$$\sqrt{\Phi} = \frac{\sqrt{b^2(1+a^2) + (a^2-b^2)\sin^2(\theta)}}{[1+a^2-(a^2-b^2)\sin^2(\theta)]} \qquad (34F)$$

or $$\sqrt{\Phi} = \frac{b^2(1+a^2) + (a^2-b^2)\sin^2(\theta)}{[1+a^2-(a^2-b^2)\sin^2(\theta)]\sqrt{b^2(1+a^2)+(a^2-b^2)\sin^2(\theta)}} \qquad (34G)$$

$$= \frac{b}{(1+a^2)^{1/2}} \frac{1 - \frac{(b^2-a^2)}{b^2(1+a^2)}\sin^2(\theta)}{\left[1 - \frac{(a^2-b^2)}{(1+a^2)}\sin^2(\theta)\right]\sqrt{1 - \frac{(b^2-a^2)}{b^2(1+a^2)}\sin^2(\theta)}}.$$

The normalized circumference is then given by:

$$\Lambda = \frac{1}{2\pi} \int_0^{2\pi} \sqrt{\Phi} \, d\theta \qquad (34H)$$

Since an arc length for each quadrant is the same, the normalized circumference, Λ, may be reduced to:

$$\Lambda = \frac{2}{\pi} \int_0^{\pi/2} \sqrt{\Phi} \, d\theta \qquad (34\text{I})$$

or $$\Lambda = \frac{2b}{\pi(1+a^2)^{1/2}} \qquad (34\text{J})$$

$$\int_0^{\pi/2} \frac{1 - \frac{(b^2-a^2)}{b^2(1+a^2)}\sin^2(\theta)}{\left[1 - \frac{(a^2-b^2)}{(1+a^2)}\sin^2(\theta)\right]\sqrt{1 - \frac{(b^2-a^2)}{b^2(1+a^2)}\sin^2(\theta)}} \, d\theta$$

The integral $I_1$ of equation (34J) may be expressed in two equivalent equations (34K) and (34N):

$$I_1 = \int_0^{\pi/2} \frac{1 - \frac{(a^2-b^2)}{(1+a^2)}\sin^2(\theta) + \frac{(a^2-b^2)}{(1+a^2)}\sin^2(\theta) - \frac{(b^2-a^2)}{b^2(1+a^2)}\sin^2(\theta)}{\left[1 - \frac{(a^2-b^2)}{(1+a^2)}\sin^2(\theta)\right]\sqrt{1 - \frac{(b^2-a^2)}{b^2(1+a^2)}\sin^2(\theta)}} \, d\theta \qquad (34\text{K})$$

$$= \int_0^{\pi/2} \frac{1}{\sqrt{1 - \frac{(b^2-a^2)}{b^2(1+a^2)}\sin^2(\theta)}} \, d\theta + \left(\frac{(a^2-b^2)}{(1+a^2)} - \frac{(b^2-a^2)}{b^2(1+a^2)}\right) \qquad (34\text{L})$$

$$\underbrace{\int_0^{\pi/2} \frac{\sin^2(\theta)}{\left[1 - \frac{(a^2-b^2)}{(1+a^2)}\sin^2(\theta)\right]\sqrt{1 - \frac{(b^2-a^2)}{b^2(1+a^2)}\sin^2(\theta)}} \, d\theta}_{II}$$

$$= K\left(\frac{(b^2-a^2)}{b^2(1+a^2)}\right) + \left(\frac{(a^2-b^2)}{(1+a^2)} - \frac{(b^2-a^2)}{b^2(1+a^2)}\right) II \qquad (34\text{M})$$

$$I_2 = \int_0^{\pi/2} \frac{1 - \frac{(b^2-a^2)}{b^2(1+a^2)}\sin^2(\theta)}{\left[1 - \frac{(a^2-b^2)}{(1+a^2)}\sin^2(\theta)\right]\sqrt{1 - \frac{(b^2-a^2)}{b^2(1+a^2)}\sin^2(\theta)}} \, d\theta, \qquad (34\text{N})$$

$$= \int_0^{\pi/2} \frac{1}{\left[1 - \frac{(a^2-b^2)}{(1+a^2)}\sin^2(\theta)\right]\sqrt{1 - \frac{(b^2-a^2)}{b^2(1+a^2)}\sin^2(\theta)}} \, d\theta - \qquad (34\text{O})$$

$$\frac{(b^2-a^2)}{b^2(1+a^2)}$$

$$\underbrace{\int_0^{\pi/2} \frac{\sin^2(\theta)}{\left[1 - \frac{(a^2-b^2)}{(1+a^2)}\sin^2(\theta)\right]\sqrt{1 - \frac{(b^2-a^2)}{b^2(1+a^2)}\sin^2(\theta)}} \, d\theta}_{II}$$

$$= \Pi\left(\frac{(a^2-b^2)}{(1+a^2)}, \frac{(b^2-a^2)}{b^2(1+a^2)}\right) - \frac{(b^2-a^2)}{b^2(1+a^2)} II \qquad (34\text{P})$$

Since the two integral expressions, $I_1$ and $I_2$, are equivalent, II may be solved by equating the two expressions so that II is given in terms of a, b, K and $\Pi$. Substituting the expression of II from equation (34P) into equation (34M), the normalized circumference is:

$$\Lambda(a,b) = \frac{2}{\pi b\sqrt{1+a^2}}\left((1+b^2)\Pi\left(\frac{a^2-b^2}{1+a^2}, \frac{b^2-a^2}{(1+a^2)b^2}\right) - K\left(\frac{b^2-a^2}{(1+a^2)b^2}\right)\right) \qquad (34\text{Q})$$

The normalized circumferential measure is a dimensionless quantity. In one embodiment, where the ellipse is a circle, e.g., r=a=b, the normalized circumferential measure may be reduced to:

$$\Lambda = \frac{r}{\sqrt{1+r^2}} \qquad (34\text{R})$$

A normalized circumference measure map engine 178 may construct a normalized circumference map based on the determined normalized circumferential measure of an area of interest. The constructed normalized circumference map may be used by the rendering engine 176 to generate a human-viewable display of an image of uncertainty which may be displayed on the display 180.

Figure 4:
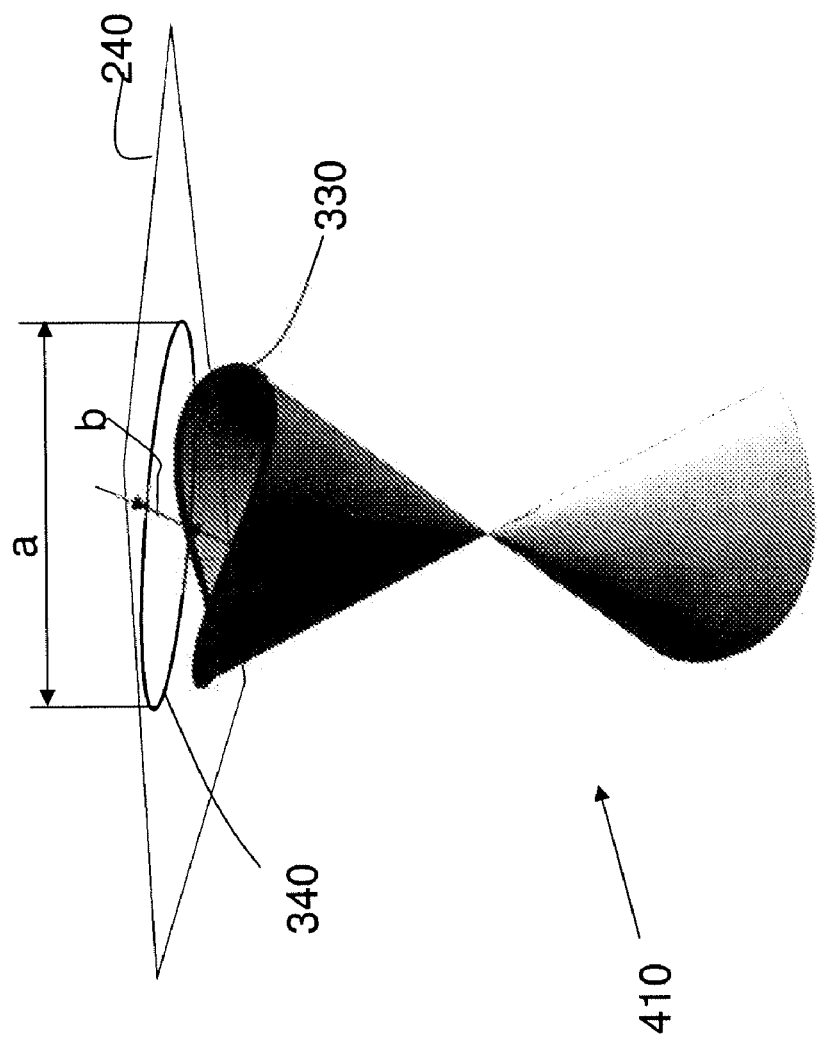
FIG. 4 illustrates an exemplary a cone of uncertainty constructed according to an exemplary embodiment of the invention.

With continuing reference to FIGS. 1B, and 2-3 and further reference to FIG. 4, the COU determining engine 170 may construct a cone of uncertainty 410 based on the inverse Gnomonic projection of an ellipse 340 of the u, v-plane 240 into the unit sphere 210, illustrated in FIG. 3.

In an example provided below, the technique of error propagation via diffusion tensor representations is denoted by "EP" while the reformulated perturbation technique described above is denoted by "RP".

A synthetic diffusion tensor, as known in the art, may be given by:

$$\gamma = [ln(1000) \times 10^{+4} \text{ s/mm}^2 \; 9.475 \; 6.694 \; 4.829 \; 1.123 - 0.507 \; -1.63]^T \times 10^{-4} \text{ mm}^2/\text{s}$$

The eigenvalue-eigenvector pairs of the example tensor are:

$$\{10.4 \times 10^{-4} \text{ mm}^2/\text{s}, q_1 = [0.9027 \; 0.3139 \; -0.2940]^T\},$$

$$\{6.30 \times 10^{-4}, q_2 = [0.3197 \; -0.9470 \; -0.0295]^T\}, \text{ and}$$

$$\{4.30 \times 10^{-4}, q_3 = [0.2877 \; 0.0673 \; 0.9553]^T\}.$$

Further, the trace and fractional anisotropy (FA) are 0.0021 mm²/s and 0.4176, respectively.

The mean covariance matrices of the major eigenvector of the example tensor, based on EP and RP, are substantially equal to one another:

$$_{RP}\Sigma_{q_1} \approx \, _{EP}\Sigma_{q_1} = \begin{pmatrix} 6.0911 & -13.269 & 4.5350 \\ -13.269 & 40.379 & 2.3675 \\ 4.5350 & 2.3675 & 16.450 \end{pmatrix} \times 10^{-5}.$$

The computation above is carried out based on a signal-to-noise ratio (SNR) of 50 and on a design matrix, W, that was constructed from a 35 gradient direction set with four spherical shells having b values of 0, 500, 1000, and 1500 s/mm².

The eigenvalue-eigenvector pairs of $_{EP}\Sigma_{q_1}$ are:

$$\{\omega_1 = 4.4935 \times 10^{-4}, [0.3202, -0.9469, -0.0277]^T\},$$

$$\{\omega_2 = 1.7985 \times 10^{-4}, [0.2871 \; 0.0691 \; 0.9553]^T\},$$

and $$\{\omega_3 = 4.387 \times 10^{-20} \cong 0, [0.9027\ 0.3139\ -0.2940]^T\}.$$

The only difference between the eigenvalue-eigenvector pairs of $_{EP}\Sigma_{q_1}$ and of $_{RP}\Sigma_{q_1}$ is in the minor eigenvalue, $2.5243 \times 10^{-20}$ for $_{RP}\Sigma_{q_1}$, which is of no consequence in practice.

The angle of deviation of the two eigenvectors of $_{RP}\Sigma_{q_1}$ may be compared to that of the circular cone of uncertainty. Since the elements in $\delta D$ of equation (26) are taken to be the standard deviation of the diffusion tensor elements, let $\alpha$ be equal to approximately 0.3173, which is the area covering the two tails of the normal distribution at one standard deviation apart from the center, i.e., at $-1$ and $+1$. Therefore:

$$\mathcal{F}_{(2,140-7;0.3173)} = 1.1578$$

The angles of deviation for the major and the minor eigenvectors of $_{RP}\Sigma_{q_1}$ are given by $\theta_1 = \tan^{-1}(\sqrt{2\,\mathcal{F}(2,n-7;\alpha)\omega_1})$, and $\theta_2 = \tan^{-1}(\sqrt{2\,\mathcal{F}(2,n-7;\alpha)\omega_2})$, respectively, where $\omega_1$ and $\omega_2$ are the first two largest eigenvalues of $_{RP}\Sigma_{q_1}$. In the context of the example discussed here, $\theta_1 = 1.847°$ and $\theta_2 = 1.169°$.

Figure 5D:
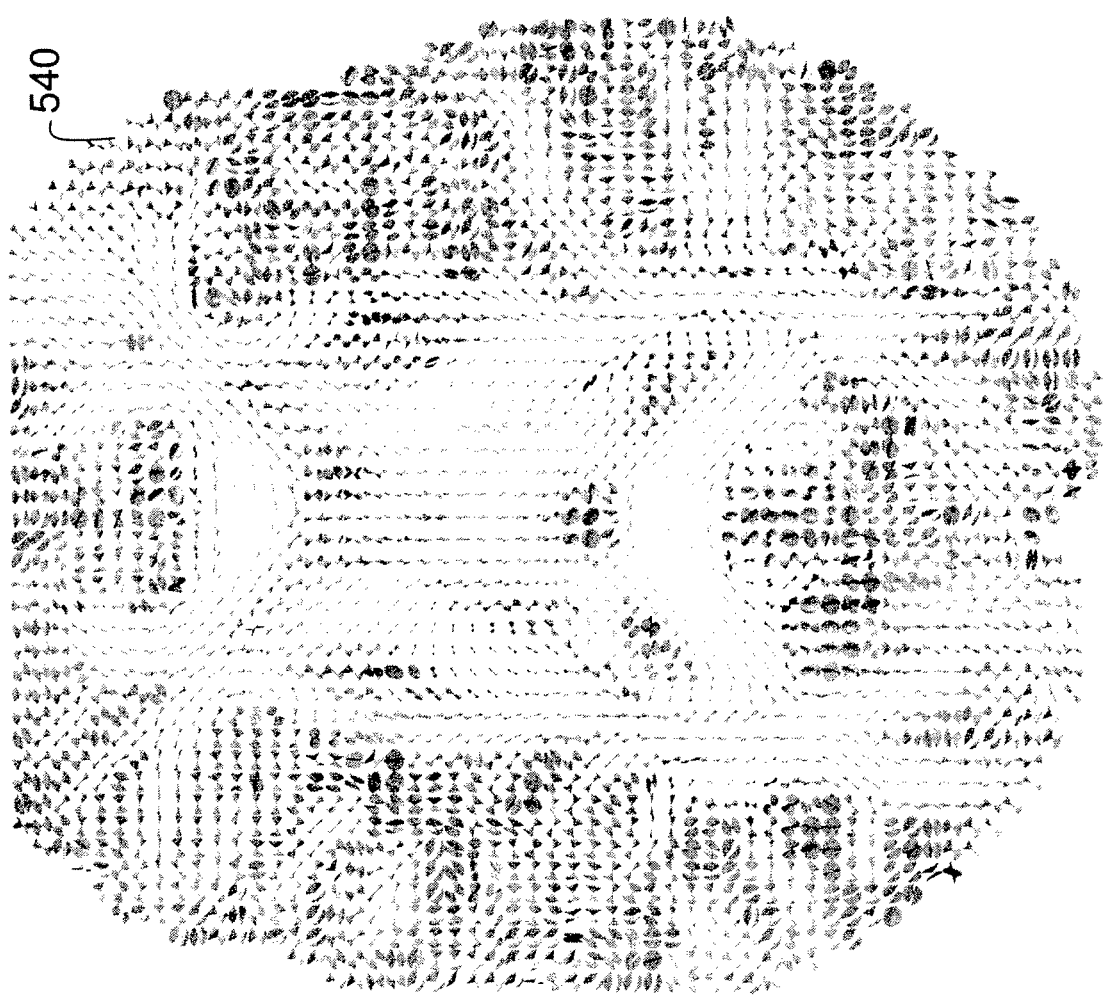
FIG. 5D illustrates an exemplary cones of uncertainty of an axial slice corresponding to the normalized areal map of FIG. 5A.

With reference to FIGS. 5A, 5B, 5C and 5D, using experimental simulated human head tensor data together with the experimental design defined in the above example, the normalized areal measure map 510, which corresponds to the 0.95 joint confidence region (or 95% confidence region) at an SNR level of 15 may be obtained. Likewise, the normalized circumference map 520 may be obtained. The eccentricity map 530 of the ellipse of the cone of uncertainty is given by $\sqrt{1-b^2/a^2}$. It is assumed that $b \leq a$. The cones of uncertainty 540 of an axial slice corresponding to the normalized areal map 510 are illustrated in FIG. 5D.

As described above, the perturbation method is reformulated to obtain the covariance of the major eigenvector of the diffusion tensor. The covariance matrix is shown to be equivalent to that derived from the error propagation method based on the Euler representation. When a mapping between representations of interest is not available then it is likely that the first order matrix perturbation method may be helpful in finding the Jacobian matrix so that the transformation from one covariance structure to another may be realized. Finally, two normalized measures of the cone of uncertainty and a technique of visualizing cone of uncertainty are described.

The proposed measures, which are directly linked to the uncertainty in the major eigenvector of the diffusion tensor, may be important for probing the integrity of the white matter tracts in the brain. In addition to that, the measures have a dependence on signal-to-noise ratio and may be used as a calibration gauge for assessing MRI system or DT-MRI acquisition performance. The described measures for quantifying uncertainty of the major eigenvector of the diffusion tensor are dimensionless and normalized to unity. The measures have direct geometric interpretations. In particular, the areal measure corresponds directly to the projection of the $1+\alpha$ joint confidence region for $q_1$ in the u, v-plane onto the unit sphere. Besides the areal measure, the circumferential measure may be important in gaining insights into the asymmetric nature of tract dispersion. The dispersion information contained in $\Sigma_{q_1}$ may be incorporated into the modeling the prior distribution of fiber coherence in probabilistic (or Bayesian) tractography.

By using the techniques described above, the COU may be constructed without overlapping cones in neighboring regions.

In an exemplary embodiment, the engines 152, 160, 164, 170, 172, 174, 176, 177, 178, and 182 may be implemented with, for example, a computer having a processing unit, persistent memory, non-persistent memory, input device(s), output device(s), etc. The computer may include software stored in memory, which when executed by the computer, causes the computer to perform the functions of one or more of the engines. The computer may include one or more dedicated devices, for example, one or more field programmable gated array (FPGA) devices, to implement one or more of the engines.

In an exemplary embodiment, the engines 152, 160, 164, 170, 172, 174, 176, 177, 178, and 182 may be implemented with one or more dedicated devices, for example, one or more field programmable gated array (FPGA) devices.

In an exemplary embodiment, the engines 152, 160, 164, 170, 172, 174, 176, 177, 178, and 182 may be implemented with one or more software modules comprising one or more software instructions stored on one or more computer-readable mediums and executable by a processing unit having one or more processors to cause the processing unit to perform the functions of the engines.

In an exemplary embodiment, the engines 152, 160, 164, 170, 172, 174, 176, 177, 178, and 182 may be implemented with a combination of one or more dedicated devices and/or one or more software modules stored on one or more computer-readable mediums.

Embodiments described above may be implemented on the same computer, computer system, or a processor. Embodiments described above may also be implemented on different computers, computer systems or processors. Further, embodiments described above may be implemented with one or more software instructions or code residing on tangible computer-readable medium or mediums of one or more computers or computer systems.

No element, act, or instruction used in the description of the exemplary embodiments should be construed as critical or essential to the exemplary embodiments unless explicitly described as such.

The invention is described in detail with respect to exemplary embodiments, and it will now be apparent from the foregoing to those skilled in the art that changes and modifications may be made without departing from the invention in its broader aspects, and the invention, therefore, as defined in the claims is intended to cover all such changes and modifications as fall within the true spirit of the invention.

The invention claimed is:

1. A magnetic resonance imaging apparatus, comprising:
   a magnetic resonance imaging scanner to acquire diffusion-weighted imaging data from a subject;
   a reconstruction engine to reconstruct the acquired diffusion-weighted imaging data into diffusion-weighted image representations of the subject;
   a diffusion tensor engine to construct a diffusion tensor map of an area of interest of the subject from the diffusion-weighted image representations, the diffusion tensor map comprising at least one voxel of tensor;
   an eigenvalue/eigenvector ordering engine to obtain and order pairs of eigenvectors and eigenvalues for at least one voxel in the constructed diffusion tensor map of the area of interest of the subject;
   a covariance matrix determining engine to construct a covariance matrix of a major eigenvector for at least one voxel, with pairs of eigenvectors and eigenvalues obtained and ordered, in the constructed diffusion tensor map of the area of interest of the subject;
   a first normalized measure determining engine to compute a first normalized uncertainty measure of at least one voxel, for the constructed covariance matrix of the major eigenvector in the constructed diffusion tensor map of the area of interest of the subject;

a second normalized measure determining engine to compute a second normalized uncertainty measure of at least one voxel, for the constructed covariance matrix of the major eigenvector in the constructed diffusion tensor map of the area of interest of the subject; and a rendering engine to generate a human-viewable display of an image representation of uncertainty from at least one of the first normalized uncertainty measure or the second normalized uncertainty measure.

2. The magnetic resonance imaging apparatus according to claim 1, wherein the first normalized uncertainty measure is an areal normalized measure based on a ratio of a region on a unit sphere enclosed by a simple closed curve to an area of a hemisphere.

3. The magnetic resonance imaging apparatus according to claim 2, wherein the areal normalized measure is:

$$\Gamma = \frac{2a}{\pi b \sqrt{1+a^2}} \left[ (1+b^2) \Pi\left(-b^2, \frac{a^2-b^2}{1+a^2}\right) - K\left(\frac{a^2-b^2}{1+a^2}\right) \right],$$

where a and b are radii of an ellipse projected into a plane, and

K and Π are, respectively, the complete elliptic integrals of the first kind and the third kind.

4. The magnetic resonance imaging apparatus according to claim 2, further comprising:

a normalized areal map constructing engine to construct an areal map of the area of interest of the subject based on the areal normalized measure.

5. The magnetic resonance imaging apparatus according to claim 1, wherein the second normalized uncertainty measure is a normalized circumference based on a ratio of a circumference of a simple closed curve on a unit sphere to a circumference of a great circle of the unit sphere.

6. The magnetic resonance imaging apparatus according to claim 5, wherein the normalized circumference is computed as:

$$\Lambda(a,b) = \frac{2}{\pi b \sqrt{1+a^2}} \left( \begin{array}{c} (1+b^2)\Pi\left(\frac{a^2-b^2}{1+a^2}, \frac{b^2-a^2}{(1+a^2)b^2}\right) - \\ K\left(\frac{b^2-a^2}{(1+a^2)b^2}\right) \end{array} \right)$$

where a and b are radii of an ellipse of an ellipse projected into a plane, and

K and Π are, respectively, the complete elliptic integrals of the first kind and the third kind.

7. The magnetic resonance imaging apparatus according to claim 5, further comprising:

a normalized circumference map constructing engine to construct a normalized circumference map of the area of interest of the subject based on the normalized circumference.

8. The magnetic resonance imaging apparatus according to claim 1, further comprising:

a cone of uncertainty constructing engine to determine a cone of uncertainty surrounding the major eigenvector for at least one voxel in the constructed diffusion tensor map of the area of interest of the subject based on the determined first and second normalized uncertainty measures, the determined cone of uncertainty to be used by the rendering engine to generate as a human-viewable display of an image representation of uncertainty.

9. A magnetic resonance imaging method, comprising:

scanning a subject with a magnetic resonance imaging scanner to acquire diffusion-weighted imaging data;

acquiring a three-dimensional diffusion tensor map of an area of interest of the subject based on the acquired diffusion-weighted imaging data;

processing the diffusion tensor map at a plurality of voxels in tensor map of the area of interest of the subject to obtain eigenvectors and eigenvalues;

constructing covariance matrices of major eigenvectors for at least a portion of the plurality of voxels in the diffusion tensor map of the area of interest of the subject;

computing first and second normalized uncertainty measures based on the constructed covariance matrices of the major eigenvectors for at least a portion of the plurality of voxels in the diffusion tensor map of the area of interest of the subject; and generating a human-viewable display of an image representation based on at least one of the first normalized uncertainty measures or the second normalized uncertainty measures for at least a portion of the plurality of voxels in the diffusion tensor map of the area of interest of the subject.

10. The method according to claim 9, wherein computing the first normalized uncertainty measures comprises:

computing ratios of regions on unit spheres enclosed by simple closed curves to areas of hemispheres.

11. The method according to claim 10, further comprising:

computing the ratios of regions on unit spheres enclosed by simple closed curves to areas of hemispheres as $$\Gamma = \frac{2a}{\pi b \sqrt{1+a^2}} \left[ (1+b^2) \Pi\left(-b^2, \frac{a^2-b^2}{1+a^2}\right) - K\left(\frac{a^2-b^2}{1+a^2}\right) \right],$$

where a and b are radii of an ellipse projected into a plane, and

K and Π are, respectively, the complete elliptic integrals of the first kind and the third kind.

12. The method according to claim 10, further comprising:

constructing areal maps of the area of interest of the subject based on the first normalized uncertainty measures.

13. The method according to claim 9, wherein computing the second normalized uncertainty measure comprises:

computing ratios of circumferences of simple closed curves on unit spheres to circumferences of great circles of the unit spheres.

14. The method according to claim 13, further comprising:

computing the ratios of circumferences of simple closed curves on unit spheres to circumferences of great circles of the unit spheres as:

$$\Lambda(a,b) = \frac{2}{\pi b \sqrt{1+a^2}} \left( \begin{array}{c} (1+b^2)\Pi\left(\frac{a^2-b^2}{1+a^2}, \frac{b^2-a^2}{(1+a^2)b^2}\right) - \\ K\left(\frac{b^2-a^2}{(1+a^2)b^2}\right) \end{array} \right)$$

where a and b are radii of an ellipse of an ellipse projected into a plane, and

K and Π are, respectively, the complete elliptic integrals of the first kind and the third kind.

15. The method according to claim 13, further comprising:
constructing normalized circumference maps of the area of interest of the subject based on the second normalized uncertainty measures.

16. The method according to claim 9, further comprising:
determining cones of uncertainty surrounding the major eigenvectors for the plurality of voxels based on the first and second normalized uncertainty measures, the determined cones of uncertainty to be used for generating a human-viewable display of an image representation of uncertainty.

17. A magnetic resonance imaging apparatus, comprising:
means for acquiring diffusion-weighted imaging data from a subject;
means for reconstructing the acquired diffusion-weighted imaging data into diffusion-weighted image representations of the subject;
means for constructing a diffusion tensor map of an area of interest of the subject from the reconstructed diffusion-weighted image representations, said diffusion tensor map comprising at least one voxel of tensor;
means for obtaining and ordering pairs of eigenvectors and eigenvalues for at least one voxel in the constructed diffusion tensor map of the area of interest of the subject;
means for constructing a covariance matrix of a major eigenvector for at least one voxel, with pairs of eigenvectors and eigenvalues obtained and ordered, in the constructed tensor map of the area of interest of the subject;
means for computing a first normalized uncertainty measure of at least one voxel, for which the covariance matrix of the major eigenvector has been constructed, in the constructed tensor map of the area of interest of the subject;
means for computing a second normalized uncertainty measure of at least one voxel, for which the covariance matrix of the major eigenvector has been constructed, in the constructed tensor map of the area of interest of the subject; and
means for generating a human-viewable display of an image representation of uncertainty based on at least one of the first normalized uncertainty measure or the second normalized uncertainty measure.

18. One or more computer-readable mediums comprising software, which software, when executed by a computer system, causes the computer to perform operations to analyze diffusion-weighted imaging representations reconstructed from acquired diffusion-weighted imaging data of a subject, the computer-readable medium comprising:
one or more instructions executable by the computer to construct a diffusion tensor map of an area of interest of the subject from the reconstructed diffusion-weighted image representations of the subject, said diffusion tensor map comprising at least one voxel of tensor;
one or more instructions executable by the computer to obtain and order pairs of eigenvectors and eigenvalues for at least one voxel in the constructed diffusion tensor map of the area of interest of the subject;
one or more instructions executable by the computer to construct a covariance matrix of a major eigenvector for at least one voxel, with pairs of eigenvectors and eigenvalues obtained and ordered, in the constructed diffusion tensor map of the area of interest of the subject;
one or more instructions executable by the computer to compute a first normalized uncertainty measure of at least one voxel, for which the covariance matrix of the major eigenvector has been constructed, in the constructed diffusion tensor map of the area of interest of the subject;
one or more instructions executable by the computer to compute a second normalized uncertainty measure of at least one voxel, for which the covariance matrix of the major eigenvector has been constructed, in the constructed diffusion tensor map of the area of interest of the subject; and
one or more instructions executable by the computer for generating a human-viewable display of an image representation of uncertainty based on at least one of the first normalized uncertainty measure.

* * * * *